United States Patent [19]
Ribner

[11] Patent Number: 5,148,166
[45] Date of Patent: Sep. 15, 1992

[54] THIRD ORDER SIGMA DELTA OVERSAMPLED ANALOG-TO-DIGITAL CONVERTER NETWORK WITH LOW COMPONENT SENSITIVITY

[75] Inventor: David B. Ribner, Schenectady, N.Y.

[73] Assignee: General Electric Company, Schenectady, N.Y.

[21] Appl. No.: 550,763

[22] Filed: Jul. 10, 1990

Related U.S. Application Data

[63] Continuation-in-part of Ser. No. 505,384, Apr. 6, 1990, abandoned, and Ser. No. 513,452, Apr. 23, 1990, Pat. No. 5,103,229.

[51] Int. Cl.⁵ .............................. H03M 3/00
[52] U.S. Cl. .................................. 341/143
[58] Field of Search ............ 341/143, 118, 120, 139; 375/26, 33, 28, 27, 31, 32, 30

[56] References Cited

U.S. PATENT DOCUMENTS

| | | | |
|---|---|---|---|
| 4,704,600 | 11/1987 | Uchimura et al. | 341/143 X |
| 4,843,390 | 6/1989 | van Bavel et al. | 341/139 |
| 4,851,841 | 7/1989 | Sooch | 341/143 |
| 4,862,169 | 8/1989 | van Bavel et al. | 341/143 |
| 4,876,542 | 10/1989 | van Bavel et al. | 341/143 |
| 4,920,544 | 4/1990 | Endo et al. | 341/143 X |
| 4,939,516 | 7/1990 | Early | 341/143 |
| 4,999,625 | 3/1991 | Thompson | 341/143 X |

FOREIGN PATENT DOCUMENTS

0354060 2/1990 European Pat. Off. .

OTHER PUBLICATIONS

Longo et al., "A 13 bit ISDN-band Oversampled ADC using Two-Stage Third Order Noise Shaping", IEEE Custom Integrated Circuits Conference, 1988.
IEEE International Symposium on Circuits and Systems, vol. 1 of 3, Portland Hilton, Portland, Oreg., May 8-11, 1989, pp. 247-249.

*Primary Examiner*—Sharon D. Logan
*Attorney, Agent, or Firm*—Marvin Snyder; James C. Davis, Jr.

[57] ABSTRACT

An improved modulator network for an interpolative oversampled (sigma-delta) analog-to-digital converter comprises a second-order modulator, which performs double integration of error between its digital output signal and its analog input signal, and a first-order modulator, which performs single integration of error between its digital output signal and an analog signal supplied thereto from the second-order modulator. The modulators supply their output signals to a digital error cancellation circuit which suppresses in the signal supplied to a decimation filter the quantization noise arising in the second-order modulator. The network exhibits significantly reduced sensitivity to the practical nonidealities that normally limit the resolution of analog-to-digital converters of this type, i.e., component matching, amplifier nonlinearity, finite gain, settling time, and signal dynamic range.

32 Claims, 14 Drawing Sheets

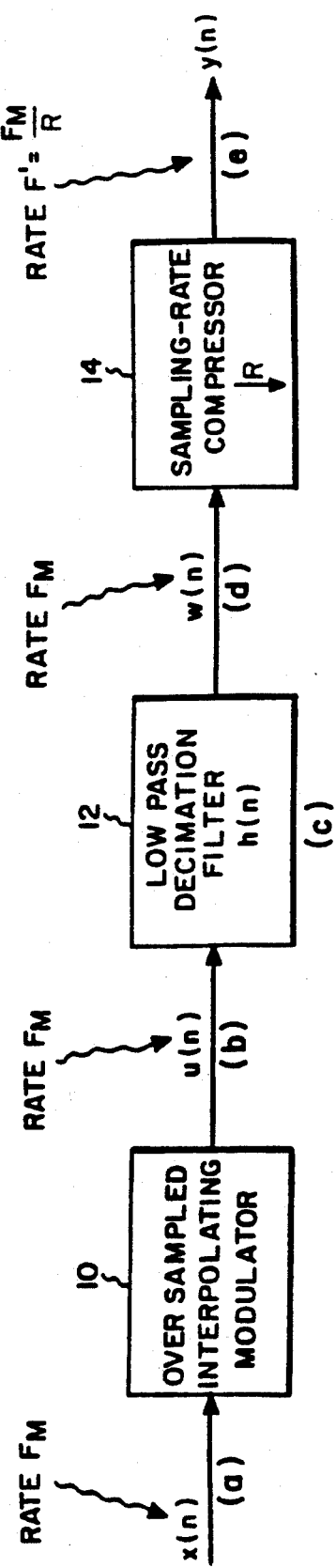
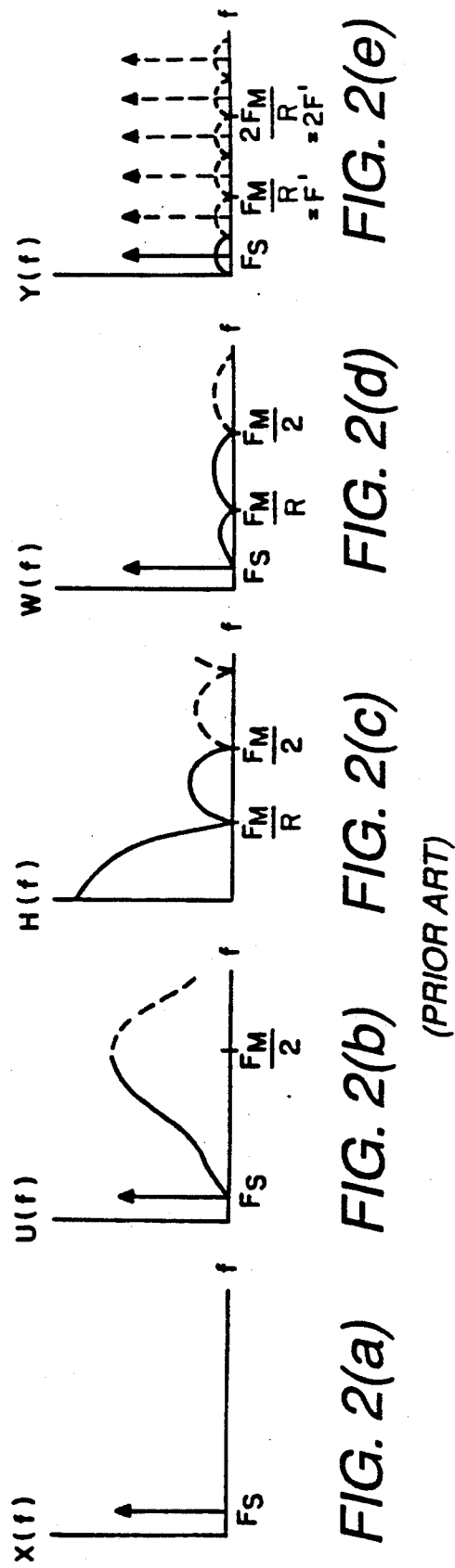
FIG. 1 (PRIOR ART)
FIG. 2(a) (PRIOR ART) FIG. 2(b) FIG. 2(c) FIG. 2(d) FIG. 2(e)

THIRD ORDER SIGMA DELTA OVERSAMPLED ANALOG-TO-DIGITAL CONVERTER NETWORK WITH LOW COMPONENT SENSITIVITY

This is a continuation-in-part of U.S. patent application Ser. No. 505,384 filed Apr. 6, 1990, abandoned at the filing of this application, and of U.S. patent application Ser. No. 513,452 filed Apr. 23, 1990 now U.S. Pat. No. 5,103,229.

CROSS REFERENCE TO RELATED APPLICATION

This application is related in subject matter to the U.S. patent application Ser. No. 505,382 filed Apr. 6, 1990 by David B. Ribner and Richard D. Baertsch, entitled "High Order Sigma Delta Oversampled Analog-To-Digital Converter Integrated Circuit Network With Minimal Power Dissipation and Chip Area Requirements" and assigned to the instant assignee. The subject matter thereof is hereby incorporated by reference.

BACKGROUND OF THE INVENTION

1. Field of the Invention

This invention generally relates to a third-order sigma-delta analog-to-digital converter and, more particularly, to a third-order sigma-delta oversampled analog-to-digital converter network with low sensitivity component mismatch and finite amplifier gain.

2. General Description of the Prior Art

High resolution analog-to-digital (or A/D) signal conversion can be achieved with lower resolution components through the use of oversampled interpolative (or sigma-delta) modulation followed by digital low pass filtering and decimation. Oversampling refers to operation of the modulator at a rate many times above the signal Nyquist rate, whereas decimation refers to reduction of the clock rate down to the Nyquist rate.

Sigma delta modulators (sometimes referred to as delta sigma modulators) have been used in analog-to-digital converters for some time. Detailed general information can be obtained from the following technical articles which are hereby incorporated by reference.

1) "A Use of Limit Cycle Oscillators to Obtain Robust Analog to Digital Converters", J. C. Candy, IEEE Transactions on Communications, Vol. COM-22, No. 3, pp. 298-305, March 1974
2) "Using Triangularly Weighted Interpolation to Get 13-Bit PCM from a Sigma-Delta Modulator", J. C. Candy, et al., IEEE Transactions on Communications, Vol. COM-24, No. 11, pp. 1268-1275, November 1976
3) "A Use of Double Integration in Sigma Delta Modulation", J. C. Candy, IEEE Transactions on Communications, Vol. COM-33, No. 3, pp. 249-258, March 1985.

Substantial effort has been expended in the field of oversampled analog-to-digital converter design to develop plural-order sigma-delta modulators in order to obtain higher resolution for a given oversampling ratio. As the term "order" is used herein, the order of a sigma-delta modulator is determined directly by how many times the error between its output and input signals is integrated with respect to time, while the order of a sigma-delta converter stage within a plural-stage sigma-delta A/D converter is determined directly by how many times the input signal to that stage is integrated with respect to time in reaching the output connection of that stage.

In the above type of analog-to-digital converter, resolution is predominantly governed by two factors: (1) the ratio of the modulator clock to the Nyquist rate, henceforth referred to as the oversampling ratio, and (2) the "order" of the modulator. "Order" in this context is analogous to the order of a frequency selective filter and indicates the relative degree of spectral shaping that is provided by the modulator. As with a filter, higher selectivity is obtainable with a higher order at the expense of increased hardware complexity. In recognition of these two factors, recent implementations of high resolution oversampled analog-to-digital converters have employed both large oversampling ratios and high modulator order. However, practical considerations can limit the extent to which oversampling rate and modulator order can be taken. For instance, for a given modulator clock rate, the oversampling ratio is inversely proportional to the Nyquist rate after decimation and thus cannot be made arbitrarily high without sacrificing conversion rate. Different considerations set bounds on the modulator order. Implementations of order greater than two, using a single quantizer, can be shown to be only conditionally stable and are therefore not viable.

An alternative approach can be used to effectively provide high order noise shaping with cascaded low-order modulators to ensure stable operation. Unfortunately, the matching of the modulators in such structure is crucial, and the degree of mismatch governs accuracy of the overall converter. Requirements of close component matching and high operational amplifier (or "op amp") gains imply that such circuit can only be manufactured with a low yield, and possibly will require trimming, thereby being expensive to produce.

Early work in this field has been directed at implementation of modulators of first and second order, due to the stability concerns associated with orders of three or greater. T. Hayashi et al., in "A Multistage Delta-Sigma Modulator Without Double Integrator Loop", Proc. IEEE 1986 Int. Solid-State Circuits Conf., pp. 182-183, February 1986, describe an approach in which second-order performance is obtained using a cascade connection of two first-order stages. The quantization error of the first stage is supplied to the second stage so that the second stage output signal, after a digital differentiation, contains a replica of the frequency-shaped quantization noise. Finally, a subtraction of the second stage output signal from that of the first stage yields a signal that contains only the quantization noise of the second stage with second-order noise-shaping. However, this method requires tight matching of the characteristics of the two first-order modulators and high op amp gains. Furthermore, there is a strong desire to employ a third-order modulator in which first- and second-order quantization noise do not accompany the digital output signal generated by the oversampling analog-to-digital converter network.

An extension of the Hayashi et al approach to third-order analog-to-digital converter networks using a triple cascade connection of first-order modulators is described by Y. Matsuya et al. in "A 16-Bit Oversampling A-D Conversion Technology Using Triple Integration Noise Shaping", IEEE J. Solid-State Circuits, Vol. SC-22, No. 6, pp. 921-929, December 1987. However, this approach requires even tighter component matching and also requires high op amp gains in order to achieve the theoretically obtainable resolution.

A slightly different approach is disclosed by L. Longo and M. A. Copeland in "A 13-Bit ISDN-Band ADC Using Two-Stage Third Order Noise Shaping", Proc. 1988 Custom Integrated Circuit Conf., pp. 21.2.1-4, June 1988, wherein a second-order modulator is connected in cascade with a first-order modulator to implement third-order noise-shaping. This approach has the advantage of reducing the component matching requirements somewhat from the other implementations.

An improved third-order sigma-delta analog-to-digital converter which achieves third-order noise-shaping with reduced sensitivity to component mismatching, finite amplifier gain and other nonideal circuit attributes, herein referred to as "nonidealities" was sought by the present inventor. Improved architectures for third-order sigma-delta analog-to-digital converters which can be implemented as sampled data switched-capacitor circuits were sought by the present inventor. The present inventor also sought to provide third-order quantization noise-shaping in a third-order sigma-delta analog-to-digital converter with a modulator network architecture that employs amplifiers of finite gain and is relatively insensitive to normal circuit nonidealities so that A/D converter resolution approaching the theoretical limits can be obtained.

A new third-order sigma-delta analog-to-digital converter network has been developed by the present inventor that exhibits significantly reduced sensitivity to the practical nonidealities that normally limit resolution of prior-art third-order sigma-delta analog-to-digital converter networks, i.e., component mismatching, amplifier non-linearity, finite gain, excessive settling time, and limited signal dynamic range. Thorough simulations, taking into account nonidealities, indicate that 16-bit resolution at an 80 kHz conversion rate is achievable with the new A/D converter network operated at an oversampling ratio of 64. This performance is attainable despite component matching of only 2% and op amp gains as low as 1000. The realization of these performance levels despite only modest required circuit specifications indicate that a low cost, highly manufacturable A/D converter network is now practicable. MOS, CMOS, BiCMOS, GaAs. or Bipolar integrated circuit technologies can be used with this new A/D converter network to implement a completely monolithic A/D converter network with no external components other than decoupling capacitors.

SUMMARY OF THE INVENTION

An oversampled interpolative (sigma-delta) analog-to-digital converter network embodying the invention includes a second-order modulator receiving the analog signal to be converted as its input signal and responding with a digital output signal thereof from an analog-to-digital converter therewithin, which analog-to-digital converter introduces a quantizing error that appears in doubly differentiated form as an undesired quantization noise component of the digital output signal of the second-order modulator; a first-order modulator, receiving the digital output signal of the second-order modulator minus the quantizing error introduced by the analog-to-digital converter within the second-order modulator, and responding with a digital output signal thereof from an analog-to-digital converter therewithin; and a digital error- cancellation circuit for combining the digital output signals of the second-order modulator and the first-order modulator to obtain a digital output signal descriptive of the analog signal received as input signal by the second-order modulator, but substantially free of the undesired quantization noise component from the second-order modulator.

BRIEF DESCRIPTION OF THE DRAWING

The foregoing and other objects, aspects and advantages will be better understood from the following detailed description of a preferred embodiment of the invention with reference to the drawings, in which:

FIG. 1 is a circuit block diagram illustrating a known sigma-delta analog-to-digital converter;

FIGS. 2(a), 2(b), 2(d) and 2(e) illustrate typical power spectra associated with operation of the analog-to-digital converter of FIG. 1, while FIG. 2(c) represents a typical filter characteristic for the decimation filter of FIG. 1;

DETAILED DESCRIPTION OF A PREFERRED EMBODIMENT OF THE INVENTION

FIG. 1 shows a known embodiment of sigma-delta analog-to-digital converter in which an oversampled interpolative (sigma-delta) modulator 10 is coupled to a low pass decimation filter 12 which, in turn, is coupled to a sampling-rate compressor 14. The role of modulator 10 is to shape spectrally the quantization noise of a low resolution analog-to-digital converter so that it is predominantly concentrated at high frequency. The input signal x(n) to modulator 10 is a pure sinusoid of frequency $F_S$ and is sampled by modulator 10 at a sampling rate $F_M$. Subsequent low pass filtering and decimation can be used to remove the bulk of the quantization noise, resulting in a high resolution digital output signal at a reduced conversion rate $F_M/R$ where R is the oversampling ratio, or ratio of the output clock rate (F') to the input clock (or sample) rate $F_M$.

In FIG. 1, the following functions are represented: input signal x(n), modulator output signal u(n), filter output signal w(n), and A/D converter output signal y(n) along with the filter impulse response characteristic h(n). The corresponding frequency spectra $|X(f)|$, $|U(f)|$, $|W(f)|$, and $|Y(f)|$, and filter characteristic $|H(f)|$, respectively, are shown in FIGS. 2(a), 2(b), 2(d), 2(e) and 2(c), respectively, and represent the conditions in the circuit of FIG. 1 at locations (a), (b), (d), (e) and (c), respectively. These frequency spectra illustrate the noise shaping provided by modulator 10 and the high frequency noise rejection provided by low pass decimation filter 12 prior to the sampling rate conversion performed by compressor 14.

Figure 3:
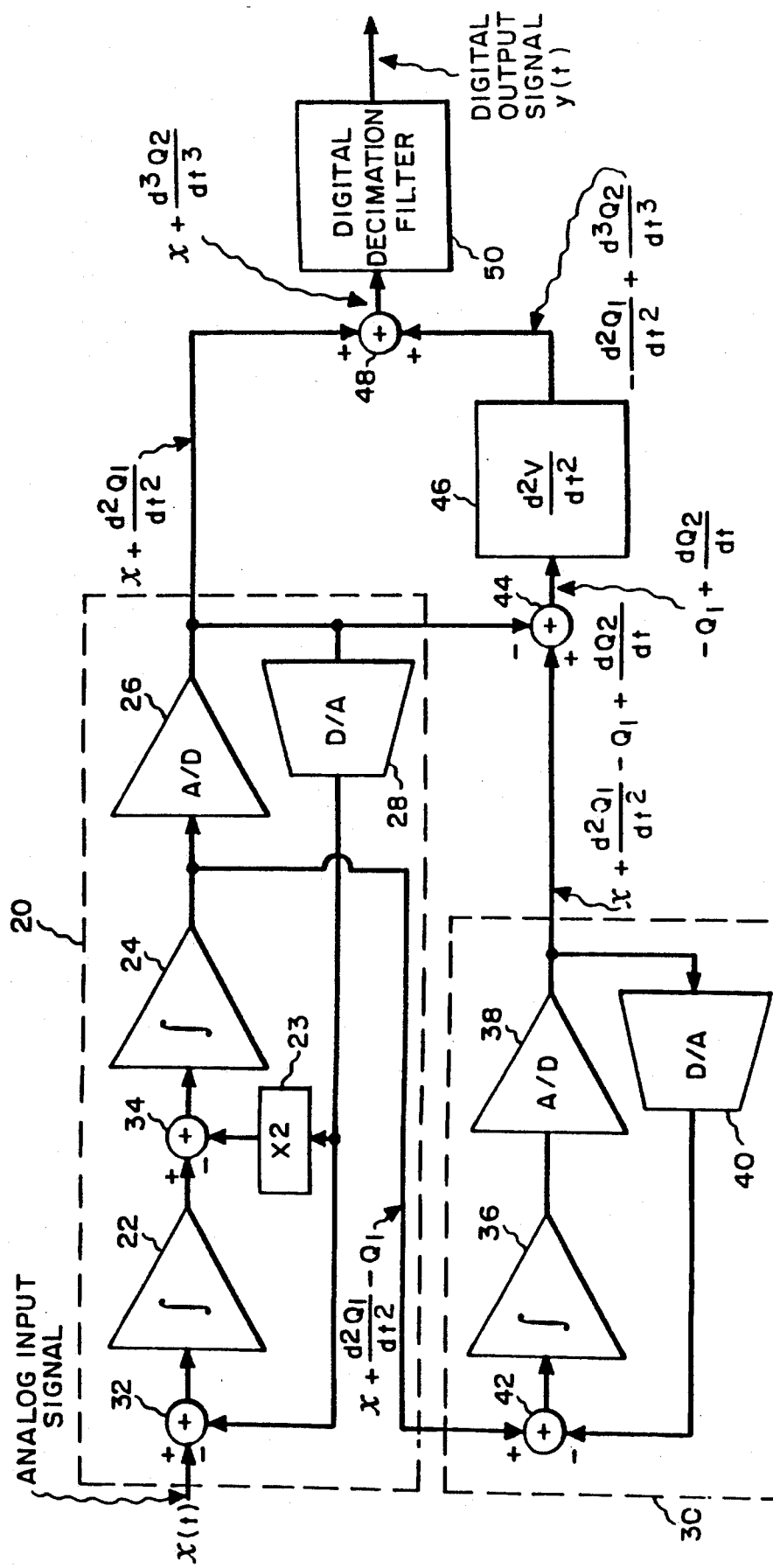
FIG. 3 is a circuit block diagram illustrating a third-order sigma-delta analog-to-digital converter network in accordance with the present invention.

A simplified block diagram of a third-order sigma-delta analog-to-digital converter network embodying the invention is shown in FIG. 3 and includes a second-order modulator 20 coupled to a first-order modulator 30. Second-order modulator 20 includes a pair of cascaded integrators 22 and 24, an analog-to-digital converter 26 coupled to the output of integrator 24, and a digital-to-analog (D/A) converter 28 coupled in a first feedback loop between the output of analog-to-digital converter 26 and the input of integrator 22 via a subtractive summing unit 32 and in a second feedback loop between the output of analog-to-digital converter 26 and the input of integrator 24 via an amplifier 23 having a gain of 2 and a subtractive summing unit 34 connected in series.

Second-order modulator 20 responds to an analog input signal x(t) and at low frequencies $\psi < \pi/T$, where T is the sampling period and $T = 1/F_M$, produces a digital output signal of approximately $$x + d^2Q_1/dt^2$$

containing a component x, which is a digital representation of the ideal analog input signal, along with a shaped quantization noise signal $d^2Q_1/dt^2$. The quantizing noise $Q_1$ generated during analog-to-digital conversion by the analog-to-digital converter 26 within the second-order modulator 20 is doubly differentiated by the two-integrator loop and pushed to substantially higher frequency in the output signal from the second-order modulator 20. The signal applied to analog-to-digital converter 26 is an analog signal $$x + d^2Q_1/dt^2 - Q_1$$

equal to the digital output signal $x + d^2Q_1/dt^2$ less the additive quantization noise $Q_1$ and is applied to first-order modulator 30.

First-order modulator 30 includes a single integrator 36 coupled to an analog-to-digital converter 38. A digital-to-analog converter 40 is coupled in a feedback loop between the output of analog-to-digital converter 38 and the input of integrator 36 via a subtractive summing unit 42. The quantizing noise $Q_2$ generated during analog-to-digital conversion by the analog-to-digital converter 38 within the first-order modulator 30 is differentiated by the single-integrator loop and pushed to higher frequency in the output signal from the first-order modulator 30. First-order modulator 30, at low frequencies $\psi < \pi/T$, produces a digital output signal of approximately $$x + d^2Q_1/dt^2 - Q_1 + dQ_2/dt$$

which is equal to an exact replica of its input signal plus the differentiated additive quantization noise signal $dQ_2/dt$.

A digital subtractor 44 is coupled to the outputs of second-order modulator 20 and first-order modulator 30 to determine the difference between the digital output signals from modulators 20 and 30. A digital double differentiator 46 is coupled to the output of digital subtractor 44 for twice differentiating the digital difference signal from digital subtractor 44. A digital adder 48 is coupled to the outputs of second-order modulator 20 and digital double differentiator 46 to add the digital output signal from modulator 20 to the resultant digital output signal produced by digital double differentiator 46. The digital output signal produced by adder 48 is applied to a digital decimation filter 50.

Ignoring for now the output quantization noise $dQ_2/dt$ of modulator 30, the difference between the two digital output signals from modulators 20 and 30 is exactly equal to minus the quantization noise $(-Q_1)$ of second-order modulator 20. A double differentiated signal $(-d^2Q_1/dt^2)$ from digital double differentiator 46 is added to the digital output signal of second-order modulator 20 by digital adder 48 to effect the cancellation of the quantization noise $Q_1$ of modulator 20.

Considering now the quantization noise signal $dQ_2/dt$ that was previously ignored, the noise signal $Q_2$ has been differentiated once by first-order modulator 30, generating a signal $dQ_2/dt$. It is further differentiated two more times by digital differentiator 46 so that, in the output signal y(t) from adder 48, the only noise is the triple differentiated noise signal $d^3Q_2/dt^3$. This amounts to a third-order shaping of the quantization noise which greatly attenuates its baseband components and emphasizes its high frequency power. The triple differentiated noise signal $d^3Q_2/dt_3$ is effectively eliminated from the final digital output signal by digital decimation filter 50.

Figure 4:
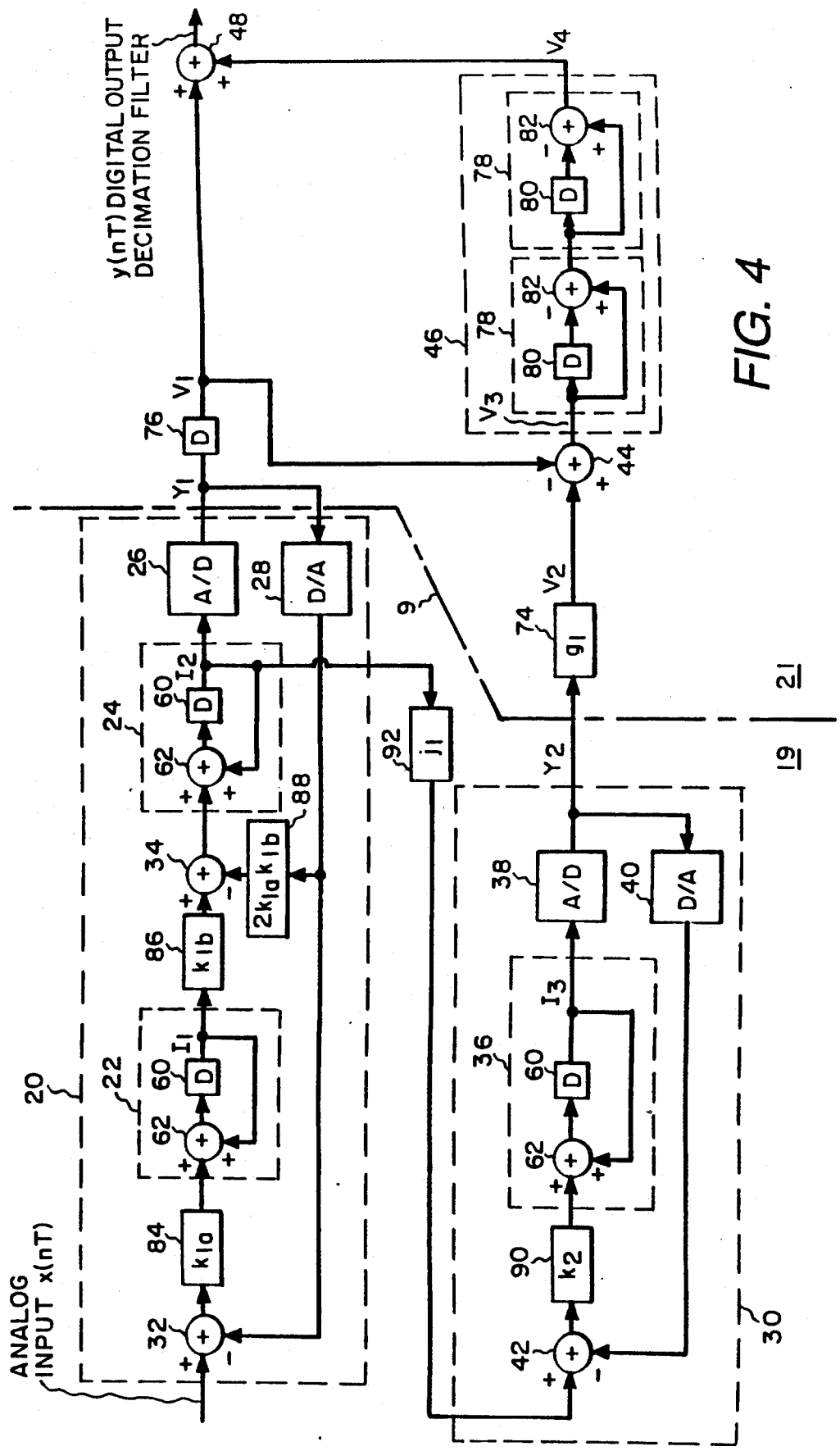
FIG. 4 is a functional block diagram of one version of the FIG. 3 type of third-order sigma-delta analog-to-digital converter network embodying the present invention.

The intended implementation of the third-order sigma-delta analog-to-digital converter network is in a sampled data switched capacitor circuit in accordance with the discrete-time domain functional block diagram of FIG. 4. A design objective with oversampled modulators is the scaling of analog signal levels to be on the order of the reference voltage. Therefore, a discrete time version is shown in FIG. 4 to indicate that such version is possible for the new converter network of the present invention.

In FIG. 4, each of integrators 22, 24 and 36 is shown as a one-cycle delay register 60 preceded by an adder (or summing) unit 62. Digital double differentiator 46 is shown as a pair of cascaded differentiators 78, each comprising a delay register 80 followed by a digital subtractor 82.

An amplifier 84 having a gain coefficient $k_{1a}$ is situated in second-order modulator 20 at the input to an integrator 22 and following a summing unit 32. An amplifier 86 with a gain coefficient $k_{1b}$ couples the output of integrator 22 to the input of an integrator 24 through a summing unit 34. Another amplifier 88 with a gain coefficient $2k_{1a}-k_{1b}$ is situated in a feedback loop of second-order modulator 20 between the output of a digital-to-analog converter 28, and a negative input to summing unit 34, while a second feedback loop in modulator 20 is provided by coupling the output of converter 28 to a negative input of summing unit 32. An amplifier 92 of gain $j_1$ couples the output of integrator 24 to a subtractive summing unit 42 in first-order modulator 30, while an amplifier 90 having gain coefficient $k_2$ is situated at the input of integrator 36 after summing unit 42 in modulator 30.

A digital multiplier 74 having a multiplier coefficient $g_1$ couples the output of analog-to-digital converter 38 of first-order modulator 30 to digital subtractor 44, while digital-to-analog converter 40 couples the output of analog-to-digital converter 38 to subtractive summing unit 42. The output of analog-to-digital converter 26 of second-order modulator 20 is connected through a delay register 76 to the negative input of digital subtracter 44 and to digital adder 48. A dashed line 9 designates the separation between digital circuitry 21 and analog circuitry 19.

In FIG. 4, coefficients $k_{1a}$, $k_{1b}$, $k_2$, and $j_1$ are analog scaling coefficients, whereas g1 is a digital multiplier coefficient. These coefficients must be related according to:

$$j_1 g_1 = 1/(k_{1a} k_{1b}). \tag{1}$$

These relationships have meaning only for the case where only one-bit analog-to-digital converters and only one-bit digital-to-analog converters are used. Normally the k coefficients are selected to be less than one so as to reduce the level of internal voltages within the modulator and thereby avoid clipping. Analysis of the network of FIG. 4 results in an input signal/output signal relationship in the discrete time domain of $$v_o(n) = v(n-3) + g_1[e_2(n) - 3e_2(n-1) + 3e_2(n-2) - e_2(n-3)] \tag{2}$$

and of $$V_o(z) = z^{-3} V(z) + g_1(1-z^{-1})^3 E_2(z) \tag{3}$$

in the corresponding frequency domain, where n represents the discrete time instant nT (T being the sample period), z is the discrete time frequency variable and $E_2$ is the quantization error of the second stage. It should be noted that a trade-off exists between voltage levels and output noise intensity; specifically, if scaling is employed, then the condition $k_{1a}k_{1b}<1$ imposes $g_1>1$, and the output error is increased proportionately as indicated by Equations 2 and 3.

While the implementation shown in FIG. 4 implies the use of one-bit A/D converters and D/A converters, improvements in performance can be achieved by using multiple bit A/D and D/A converters. For cases where the quantization levels are greater than one bit, then $k_{1a}=k_{1b}=k_2=1$ in FIG. 4 and $j_1 g_1 = 1$.

Figure 5:
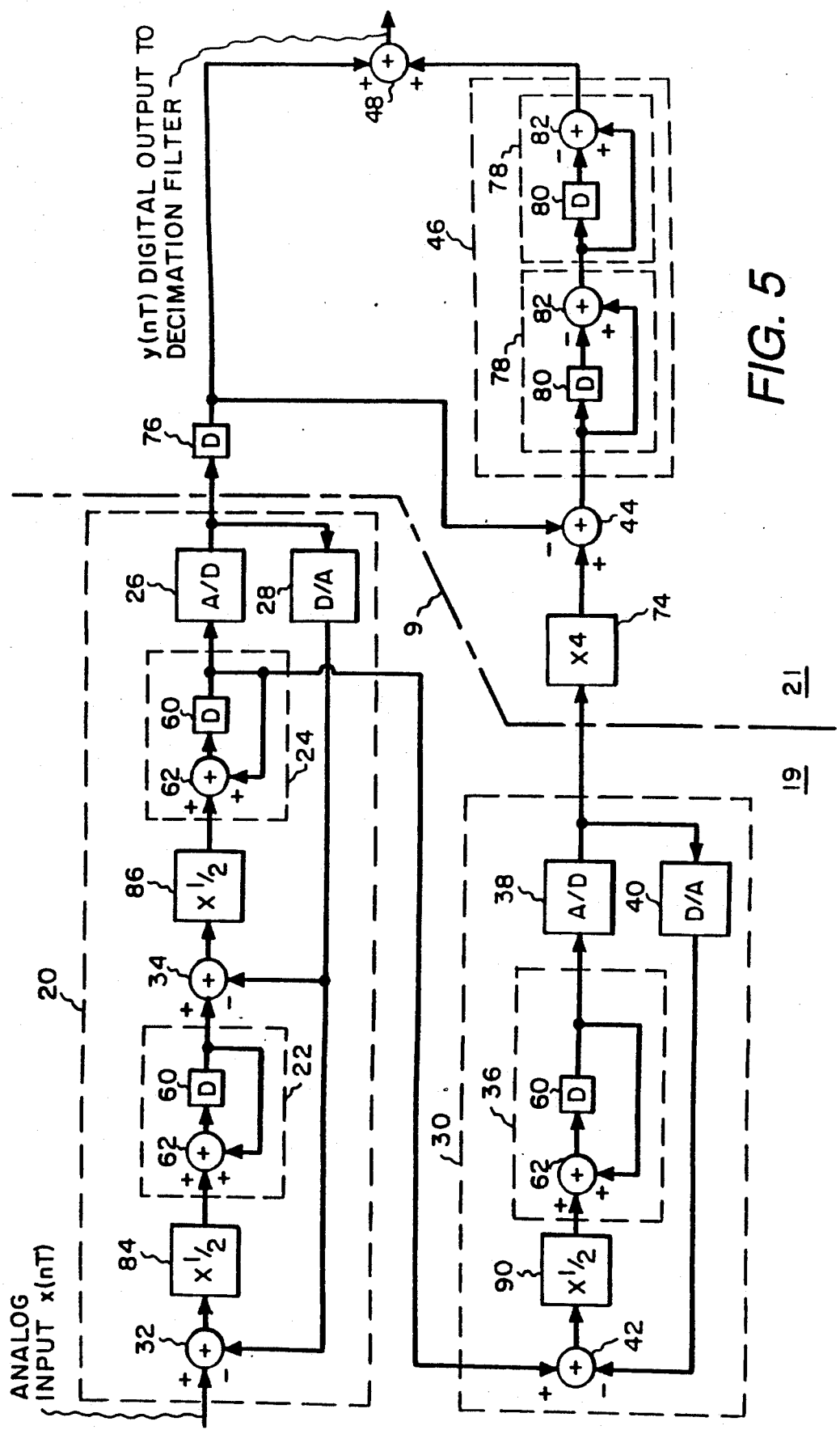
FIG. 5 is a functional block diagram of a specific embodiment of the FIG. 3 type of third-order sigma-delta analog-to-digital converter network of the present invention.

A specific implementation of the new third-order sigma-delta oversampled A/D converter network is shown in FIG. 5, with L=1, $k_{1a}=k_{1b}=k_2=\frac{1}{2}$, $j_1=1$ and $g_1=4$. Thus amplifiers 84 and 86 in second-order modulator 20 and amplifier 90 in first-order modulator 30 each have a gain coefficient of $\frac{1}{2}$, and digital multiplier 74 has a multiplier coefficient of 4. (Amplifier 92 with a gain coefficient $j_1=1$ and amplifier 88 with a gain coefficient $2k_{1a}k_{1b}=\frac{1}{2}$, employed in the circuit of FIG. 4, are not shown in the circuit of FIG. 5.) This implementation requires only one bit A/D and D/A converters.

Figure 6:
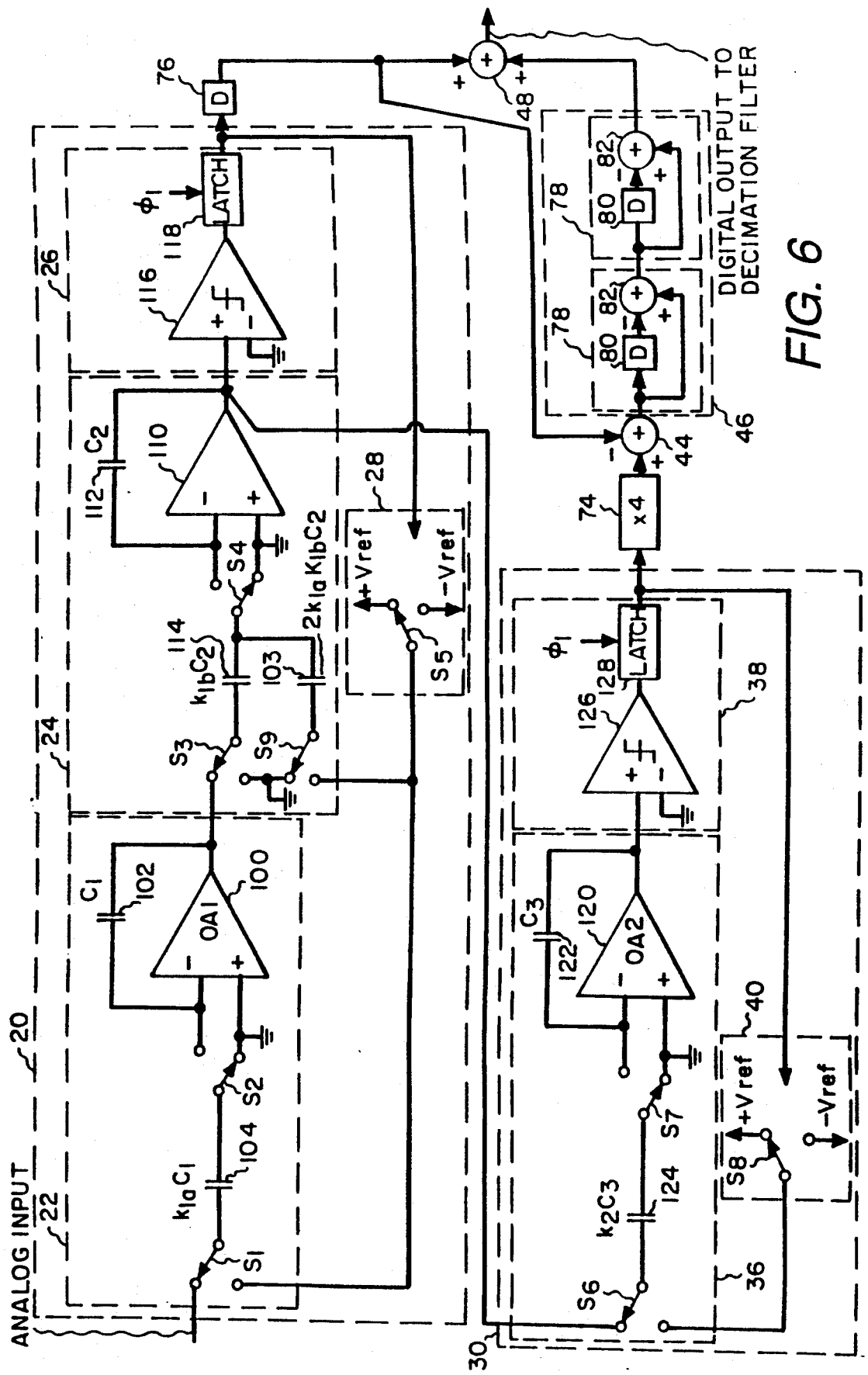
FIG. 6 is a circuit block diagram of a sampled data single-ended switched capacitor implementation of the third-order sigma-delta analog-to-digital converter network of FIG. 5.

A switched capacitor implementation of the network of FIG. 5 is shown in FIG. 6 and employs a single-ended signal flow and stray-free integrators. Such integrators are described, for example, in R. Gregorian, "Analog MOS Integrated Circuits for Signal Processing", pp. 277-280, Wiley, N.Y., 1986, incorporated herein by reference. In second-order modulator 20, integrator 22 is embodied as a high gain differential amplifier (op amp) 100 provided with a feedback capacitor 102 and a switched input capacitor 104. A switch $S_1$ is provided for switching a capacitor 104 between the analog input signal and the feedback loop of modulator 20. A switch $S_2$ is provided for switching the output voltage of capacitor 104 between the two inputs of differential amplifier 100. Similarly, integrator 24 is embodied as a high gain differential amplifier (op amp) 110 provided with a feedback capacitor 112 and a pair of switched input capacitors 114 and 103. A switch $S_3$ is provided for switching capacitor 114 between the analog output signal from differential amplifier 100 and ground while a switch $S_9$ is provided for switching capacitor 103 between the feedback loop of modulator 20 and ground. A switch $S_4$ is provided for switching the output voltage of capacitors 114 and 103 between the two inputs of differential amplifier 110. A comparator 116 operated at a sampling rate $\phi_1$ converts the analog output signal from differential amplifier 110 into a binary output signal. This binary output signal is stored by a latch 118 and applied via a delay register 76 to the negative input of digital subtractor 44 and to digital adder 48. The output signal from latch 118 also controls a switch $S_5$ for switching the feedback loop between a positive reference voltage $+V_{ref}$ and a negative reference voltage $-V_{ref}$ depending on whether the polarity of the latched output signal from comparator 116 is positive or negative.

In first-order modulator 30, integrator 36 is embodied as a high gain differential amplifier (op amp) 120 provided with a feedback capacitor 122 and a switched input capacitor 124. A switch $S_6$ is provided for switching capacitor 124 between the analog output signal from differential amplifier 110 and the feedback loop of modulator 30. A switch $S_7$ is provided for switching the output voltage of capacitor 124 between the two inputs of differential amplifier 120. A comparator 126 operated on a sampling phase $\phi_1$ converts the analog output signal from differential amplifier 120 into a binary output signal. This binary output signal is stored by a latch 128, multiplied by four by multiplier 74, and applied to digital subtractor 44. The output signal of latch 128 also controls a switch $S_8$ for switching the feedback loop between a positive reference voltage $+V_{ref}$ and a negative reference voltage $-V_{ref}$ depending on whether polarity of the latched output signal from comparator 126 is positive or negative. The digital difference signal produced by digital subtractor 44 is differentiated twice by digital double differentiator 46 and the resultant differentiated signal is applied to digital adder 48. The switches, which may be implemented by metal-oxidesemiconductor switching devices, as known in the art, are all shown in a common phase $\phi_1$.

Switches $S_1$-$S_4$, $S_6$, $S_7$ and $S_9$ are analog switches controlled by clock phase signals $\phi_1,\phi_2$ which are derived from an oscillator or clock circuit (not shown). The clock signals are nonoverlapped and 180° out of phase.

When switches $S_1$-$S_4$, $S_6$, $S_7$ and $S_9$ are in the positions illustrated in FIG. 6, capacitor 104 charges to the amplitude of the analog input signal while capacitor 114 charges to the output voltage of amp 100 and capacitor 124 charges to the output voltage of op amp 110. At the same time capacitor 103 is totally discharged.

Switches $S_5$ and $S_8$, both shown connected to a positive reference voltage, are controlled by the output signal of latch 118 and 128, respectively. Thus, when the latched value of the output signal of comparator 116 or 126 is high, switch $S_5$ or $S_8$, respectively, is connected to a positive reference voltage, and is connected to a negative reference voltage when the latched value of the output signal of comparator 116 or 126, respectively, is low.

Upon occurrence of phase $\phi_2$, the positions of switches $S_1$-$S_4$, $S_6$, $S_7$ and $S_9$ reverse from that shown in FIG. 6. Thus D/A converter 28 supplies a selected reference voltage through switch $S_5$, shown as being of positive polarity, which is added to the voltage on capacitor 104 and applied to the inverting input of amplifier 100. This input signal is integrated up in capacitor 102 until reoccurrence of clock phase $\phi_1$. At the same time, the previous (i.e., phase $\phi_1$) output voltage of amplifier 100, stored in capacitor 114, plus the reference voltage from switch $S_5$ which is now stored on capacitor 103, are supplied to the inverting input of amplifier 110, and the previous (i.e., phase $\phi_1$) output voltage of amplifier 110, stored on capacitor 124, is supplied to the inverting input of amplifier 120. Each of amplifiers 100, 110 and 120 thus performs an integration of the input voltage supplied to its respective inverting input terminal until phase $\phi_1$ again occurs.

If the signal at the input to comparator 116 is positive, switch $S_5$ is connected to the positive reference $+V_{ref}$, while if the signal is negative, switch $S_5$ is connected to the negative reference $-V_{ref}$. The signal at the comparator input is determined by an integration of a difference between the voltage developed on capacitors 103 and 114. The voltage on the output of integrator 22 is an integration of the difference between the input signal and either the positive or negative reference depending on the position of switch $S_5$. The output signal of integrator 22 can also be viewed as the integrated difference between the analog input signal and the digital representation of the analog input signal.

Integrator 22 acts as a noninverting integrator for the analog input signal, and as an inverting integrator for one-bit D/A converter 28 controlled by comparator 116. The output signal of integrator 22 changes every phase $\phi_2$ by an amount $(V_{in}-V_{D/A1})k_{1a}$, where $V_{D/A1}$ is the output voltage of D/A converter 28 while, during phase $\phi_1$, the output signal of integrator 22 remains held at the value established on the previous phase $\phi_2$. Integrator 36 operates in a similar manner, except that its input signal is the output signal of integrator 24 less the output signal of D/A converter 40; that is, the integrator 36 output signal changes every phase $\phi_2$ by an amount $(V_2-V_{D/A2})k_2$, where $V_2$ is the output voltage of integrator 36 and is held on phase $\phi_1$, and $V_{D/A2}$ is the output voltage of D/A converter 40.

The configuration of integrator 24 is slightly different from that of integrators 22 and 36 in that it uses separate capacitors 114 and 103 for its two input signals. This is necessary since different capacitor ratios are required for the two input signals to integrator 24. Specifically, the output signal of integrator 22 should be integrated with ratio $k_{1b}$ while the output signal of D/A converter 28 needs to be integrated with ratio $-2k_{1a}K_{1b}$, and therefore a combination of a noninverting and inverting switched capacitor integrator is employed as integrator 24. Through use of superposition, multiple input signals are accommodated by common connection at switch $S_4$ adjacent to the summing junction of op amp 110. Since each separate input capacitor 114 and 103 switches between ground and the op amp 110 negative input, switch $S_4$ can be shared, though individual switches $S_3$ and $S_9$ are needed for connection to the two input signals. The output signal of integrator 24 changes every phase $\phi_2$ by an amount $k_{1b}V_2-2k_{1a}k_{1b} V_{D/A2}$ and is held during phase $\phi_1$. In the circumstance that $k_{1a}=\frac{1}{2}$, the two input capacitors 114 and 103 have the same value and a single capacitor may be used instead, as with integrators 22 and 36.

The circuit of FIG. 6 is quite tolerant of capacitor mismatch errors. Each of the two switched capacitor integrators 22 and 36, respectively, employs a single switched capacitor 104 and 124, respectively, to take the difference of its two input signals. Therefore, the subtraction operation is immune to error. The remaining switched capacitor integrator 24 uses separate switched capacitors 114 and 103 to take the difference of its two input signals; however, matching errors here are negligible when referred to the input. The other remaining summation or difference operations are implemented digitally and are also error free. The only component mismatch related error is the departure of the product $k_{1a}k_{1b}$ from equaling $1/j_1g_1$. This has the effect of leaking in the quantization noise from the first stage by the amount $$[1-j_1g_1/k_{1a}k_{1b}](1-z^{-1})^2 E_1(z) \quad (4)$$

to make the overall output voltage $V_o(z)$ become $$V_o(z)+z^{-3}V_i(z)+g_1(1-z^{-1})^3 E_2(z)+ \\ [1-j_1g_1/(k_{1a}k_{1b})](1-z^{-1})^2 E_1(z) \quad (5)$$

where $E_1$ represents the quantization noise of the first stage. Since the degree of mismatch, namely, $1-j_1g_1/(k_{1a}k_{1b})$, multiplies a term that already has second-order noise shaping, i.e., $(1-z^{-1})^2 E_1(z)$, a relatively large error in $k_{1a}$ or $k_{1b}$ can be tolerated without undue degradation. For instance, it can be shown that a 5% error in the product $k_{1a}k_{1b}$ would raise the total quantization noise by less than 1 dB at an oversampling ratio of 64 to 1.

Extension simulations have been performed on a version of this new oversampled modulator. The parameters of the new analog-to-digital converter are as follows:

| Third Order Sigma Delta ADC Parameters | | |
| --- | --- | --- |
| Parameter | Spec. | Units |
| Modulator Clock Rate | 5.12 | MHz |
| Oversampling Ratio | 64 | |
| Voltage Reference | 1.25 | Volts |
| Resolution | 16 | Bits |

The simulation results are summarized below:

| Parameter | Value | Units |
|---|---|---|
| Conditions | | |
| Input Signal | 0.8 | Volts pk |
| Op Amp Gain | 1000 | |
| Op Amp Bandwidth | 80 | MHz |
| Op Amp Slew Rate | 200 | V/$\mu$s |
| Component Tolerance | 1 | % |
| Decimation Filter (using a comb filter) | sinc4 | |
| Ideal Performance | | |
| Harmonic Distortion | −145 | dB |
| Signal (Noise + Distortion) | 101.2 | dB |
| Performance With Nonidealities | | |
| Harmonic Distortion | −125 | dB |
| Signal (Noise + Distortion) | 99.2 | dB |

The invention thus constitutes an improved modulator network that achieves third-order noise shaping and yet exhibits significantly reduced sensitivity to component matching and most other practical nonidealities. Simulations have shown that a 16-bit signal-to-noise ratio can be attained despite component matching of 2% and op amp gains of 1000. It is contemplated that integrated circuits containing this modulator can be manufactured with high yields, without trimming or calibration, and without any stringent process specifications. Thus the invention contemplates a high resolution, multi-channel analog-to-digital converter which can be economically achieved.

Although the modulator components, i.e., the integrators, the analog-to-digital converters, and the digital-to-analog converters, are so far illustrated with single-ended outputs, the third-order sigma-delta analog-to-digital converter of this invention can be implemented by employing a differential signal path using integrators with differential outputs for improved rejection of power supply noise. This is shown in FIG. 7.

Figure 7:
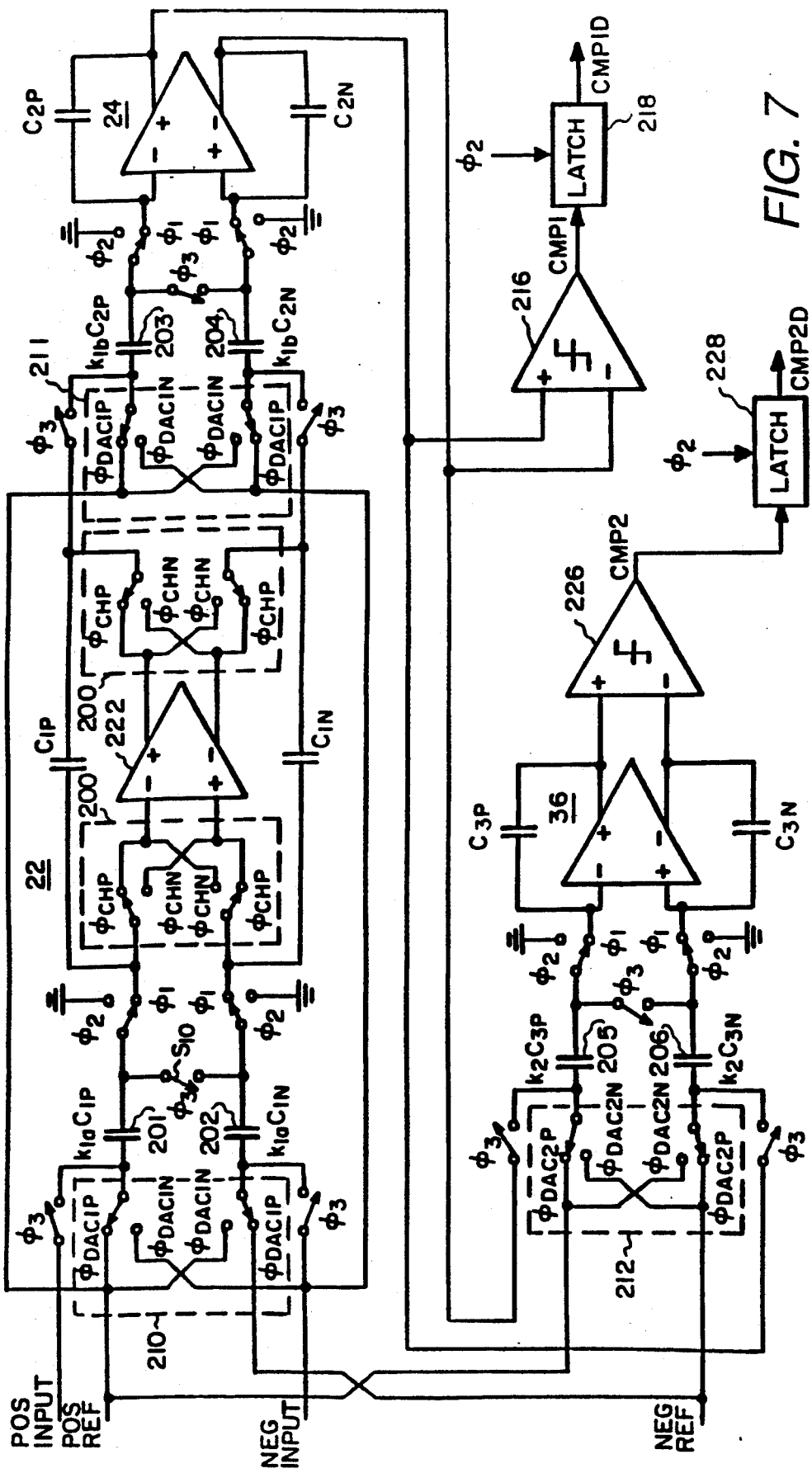
FIG. 7 is a circuit block diagram of a sampled data differential switched capacitor implementation of the third-order sigma-delta analog-to-digital converter network of FIG. 5.
Figure 8:
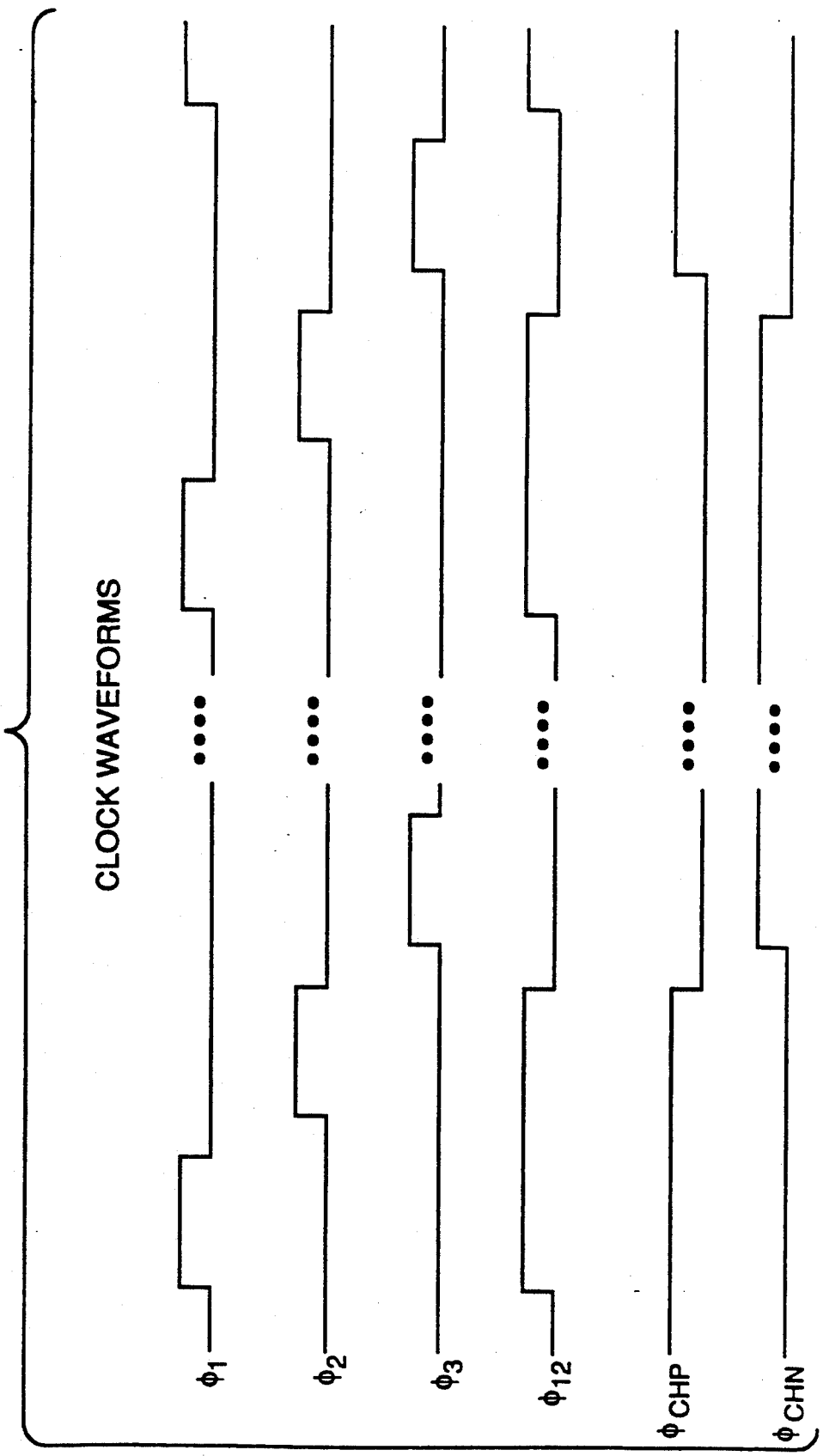
FIG. 8 illustrates waveforms of clock signals employed in the circuit of FIG. 7.

FIG. 7 illustrates a network employing differential amplifiers which is representative of the circuitry used in a third-order sigma-delta oversampled A/D converter network test chip, while FIG. 8 illustrates the clock waveforms employed in the circuit of FIG. 7. The circuit of FIG. 7 differs from the single-ended switched-capacitor A/D converter network shown in FIG. 6 in that it uses three-phase instead of two-phase clocking, it makes use of a fully-balanced (or differential) signal path for better rejection of spurious power supply noise and common mode signals, it employs a chopper stabilization circuit 200 for suppression of low frequency op amp noise, and it can be operated as a single-ended input circuit even though it is a differential circuit. Each of integrators 22, 24 and 36 employed in the circuit of FIG. 7 includes balanced outputs and balanced inputs.

In considering operation of the circuit of FIG. 7, the presence of chopper 200 as part of integrator 22 will be ignored initially by assuming chopper phase $\phi_{CHP}$ is always asserted. A balanced input signal is also assumed. In these circumstances, operation is similar to that of the single-ended circuit of FIG. 6 with the clock phases defined differently; i.e., clock phases $\phi_1$ and $\phi_2$ in the circuit of FIG. 6 now correspond to phases $\phi_3$ and $\phi_1$, respectively. Operation is the same as described for FIG. 6, if phase $\phi_2$ is temporarily ignored, except that when the input signal is sampled during phase $\phi_3$ by the two input capacitors 201 and 202, their output sides are connected together through switch $S_{10}$, instead of to ground. This connection is made so that only the differential component of the input signal is acquired. A common mode signal, if present, would also be sampled if capacitors 201 and 202 were switched to ground instead of to each other; however, in the configuration shown, the charge stored on input capacitors 201 and 202 depends only on the difference between the two input signals, not on their average value. Similar effects occur with regard to input capacitors 203 and 204 for the second stage integrator 24 of the network and input capacitors 205 and 206 for the third stage integrator 36 of the network.

As just described, the output sides of the input capacitors for each of the integrator stages would never be connected to a voltage source or ground, and hence the voltages on each of these capacitors would be arbitrary. Similarly, the voltage level at the input to the op amp receiving a signal from its input capacitors would be undefined. Therefore, to establish the potential at the output (or right-hand) side of the input capacitors, a connection to ground during phase $\phi_2$ is employed while the input (or left-hand) side of each input capacitor remains connected to receive the reference signals.

Another minor difference from the circuit of FIG. 6 is that the one-bit D/A converters 210, 211 and 212 are implemented directly at the input (or left-hand) sides of input capacitors 201 and 202, 203 and 204, and 205 and 206, respectively, instead of by employing the single pole double-throw switches $S_5$ and $S_8$ shown in the network of FIG. 6. The effect, however, is the same since the switches in each of D/A converters 210, 211 and 212 are controlled by a signal that is equal to the desired clock phase which is logically ANDed with the latched comparator signal. This implementation avoids need for a series connection of two switches and its associated speed penalty in high frequency circuit operation.

The logic for the individual switch positions in D/A converters 210, 211 and 212 is as follows:

$$\phi_{DAC1P} = \phi_{12} * CMP1D$$

$$\phi_{DAC1N} = \phi_{12} * \overline{CMP1D}$$

$$\phi_{DAC2P} = \phi_{12} * CMP2D$$

$$\phi_{DAC2N} = \phi_{12} * \overline{CMP2D}$$

where CMP1D and CMP2D are the output signals from comparator 216 at the output of second stage integrator 24, as latched by a latch circuit 218, and the output signals from comparator 226 at the output of third stage integrator 36, as latched by a latch circuit 228, respectively. Clock waveform $\phi_{12}$ is shown in FIG. 8.

In considering the role of the chopper, the MOS switching devices represented by double-pole, double-throw switches 200 on either side of the first op amp 222 perform a periodic reversal of signal polarities at the input and output of the op amp as controlled by the $\phi_{CHP}$ and $\phi_{CHN}$ chopper clock signals. Clocks $\phi_{CHP}$ and $\phi_{CHN}$, illustrated in the waveform drawings of FIG. 8, may alternate at any rate that is an integer multiple of the output conversion rate, up to a maximum rate of the modulator frequency. When clock $\phi_{CHP}$ is high, a non-inverting path through op amp 222 is selected by the chopper at both input and output, while when phase $\phi_{CHN}$ is high, an inverting configuration is produced. Since inversion takes place simultaneously at both the input and output of the op amp whenever clock $\phi_{CHN}$ is high, there is no effect on signals traversing the integrator. However, noise from the op amp itself goes through only the output switches of the chopper and, as such, alternates in polarity at a rate determined by the frequency of the chopper clocks. This is equivalent to multiplying the noise by a periodic square wave signal with an amplitude of ±1, which amounts to a modulation of the op amp noise up to the frequency of the chopper square wave and all of its harmonics. As a result, the severe low frequency flicker (or 1/f) noise is moved out of the baseband frequency of the modulator. Flicker noise is discussed in R. Gregorian, "Analog MOS Integrated Circuits for Signal Processing", previously cited, at pages 500–505, and the discussion therein is hereby incorporated by reference. Subsequent digital filtering by the decimation filter (not shown in FIG. 7) removes the modulated 1/f noise. In fact, chopping at a rate equal to the output rate of the decimation filter or a higher integer multiple, places the fundamental and harmonics of the square wave at the frequencies of the zeros of the decimation filter (if a comb-type filter is used), facilitating removal of the modulated noise. Those skilled in the art will appreciate, however, that the invention is not limited to use of a digital decimation filter, and that any signal processing circuit capable of suppressing high frequency quantization noise components may be employed instead.

Figure 9:
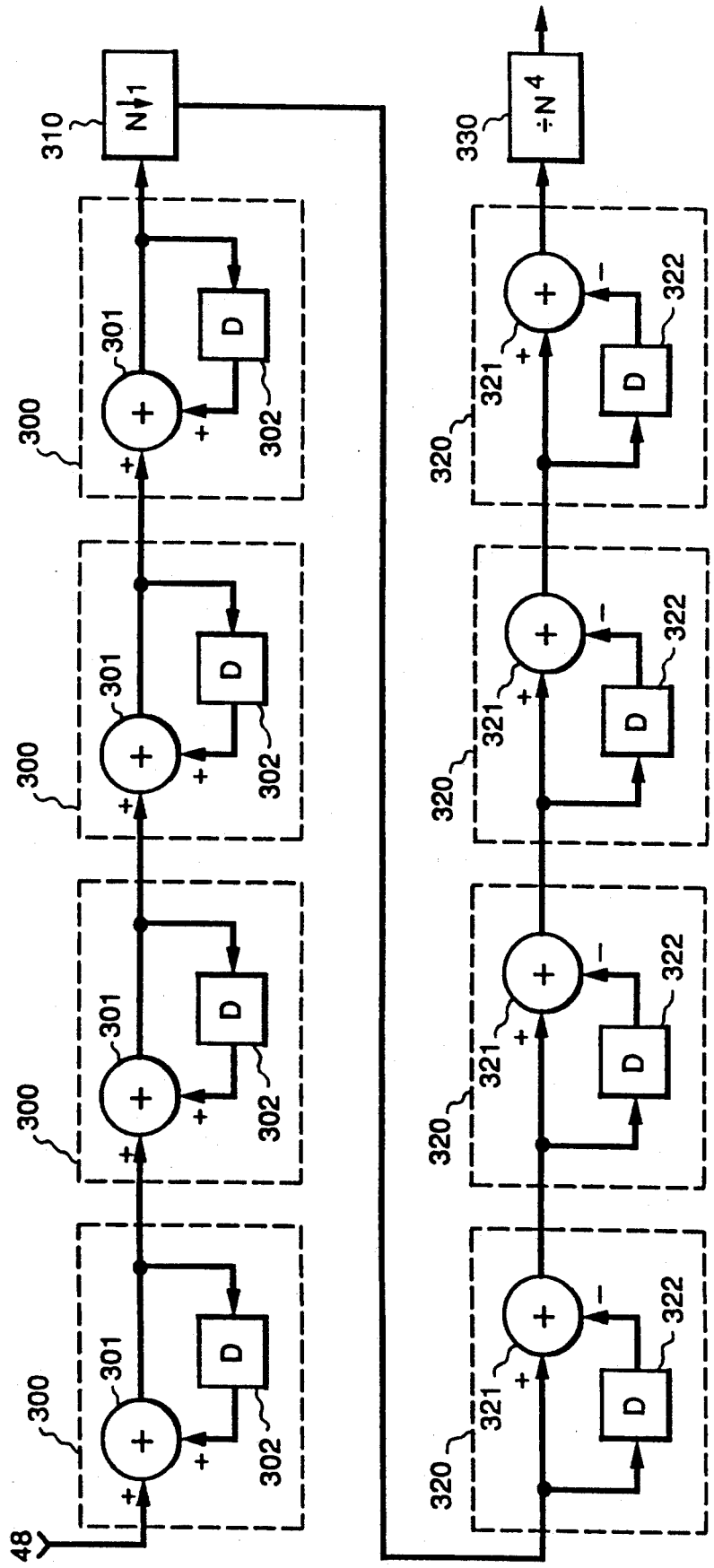
FIG. 9 is a circuit block diagram of a decimation filter that can be used in the third-order sigma-delta analog-to-digital converter networks of FIGS. 3, 4 and 5.

FIG. 9 shows a form the digital decimation filter 50 of FIG. 3 may take. FIG. 9 shows a comb filter of the since type of the type described by E. Dijkstra, O. Nye, C. Piguet and M. Degrauwe in their Paper "On the Use of Modulo Aritthmetic Comb Filters in Sigma Delta Modulators" in pages 2001–2004 of the PROCEEDINGS OF THE IEEE CONFERENCE ON ACOUSTICS, SPEECH & PROCESSING, 1988. The FIG. 3 third-order sigma-delta analog-to-digital converter network shapes its quantization noise spectrum with a sixth-order sinusoidal characteristic $$S_N(\psi T) = k_{QN} [2 \sin(\psi T/2)]^{2L}$$

where $k_{QN}$ is the power-spectral density (PSD) of the unshaped (white) quantization noise and $L=3$ is the order of the sigma-delta modulator. A comb filter of the $\text{sinc}^n$ type can adequately suppress this quantization noise, if n exceeds L by one. The FIG. 9 comb filter, wherein n equals four, will adequately suppress the $k_{QN}[2 \sin(\psi T/2)]^6$ quantization noise in the sum output signal of the adder 48 in the third-order sigma-delta analog-to-digital converter network of FIG. 3.

The FIG. 9 comb filter receives as its input signal the sum output signal from the digital adder 48 of the FIG. 3, 4 or 5 sigma-delta modulator to be quadruply integrated in a cascade of n integrators, n equalling four in the FIG. 9 comb filter, each integrator 300 comprising a respective digital adder 301 and a respective delay register 302 for feeding back the sum output of the adder 301 to an input thereof. In a decimation procedure, the quadruply integrated response of this cascade is subsampled n:1 in a digital sampler 310 as may be provided by a plural-bit latch. The subsampled response of the digital sampler 310 is quadruply differentiated in a cascade of n differentiators, n equalling four in the FIG. 9 comb filter, each differentiator 320 shown as comprising a digital adder 321 for adding together the current sample of differentiator 320 input signal to the previous sample as stored in a delay register 322, thereby to generate a sum output signal that is the derivative respective to time of the differentiator 320 input signal. The response from the final differentiator 320 is scaled down in amplitude by $n^n$ in a digital scaler 330 is the ultimate decimation filter 50 response.

Figure 10:
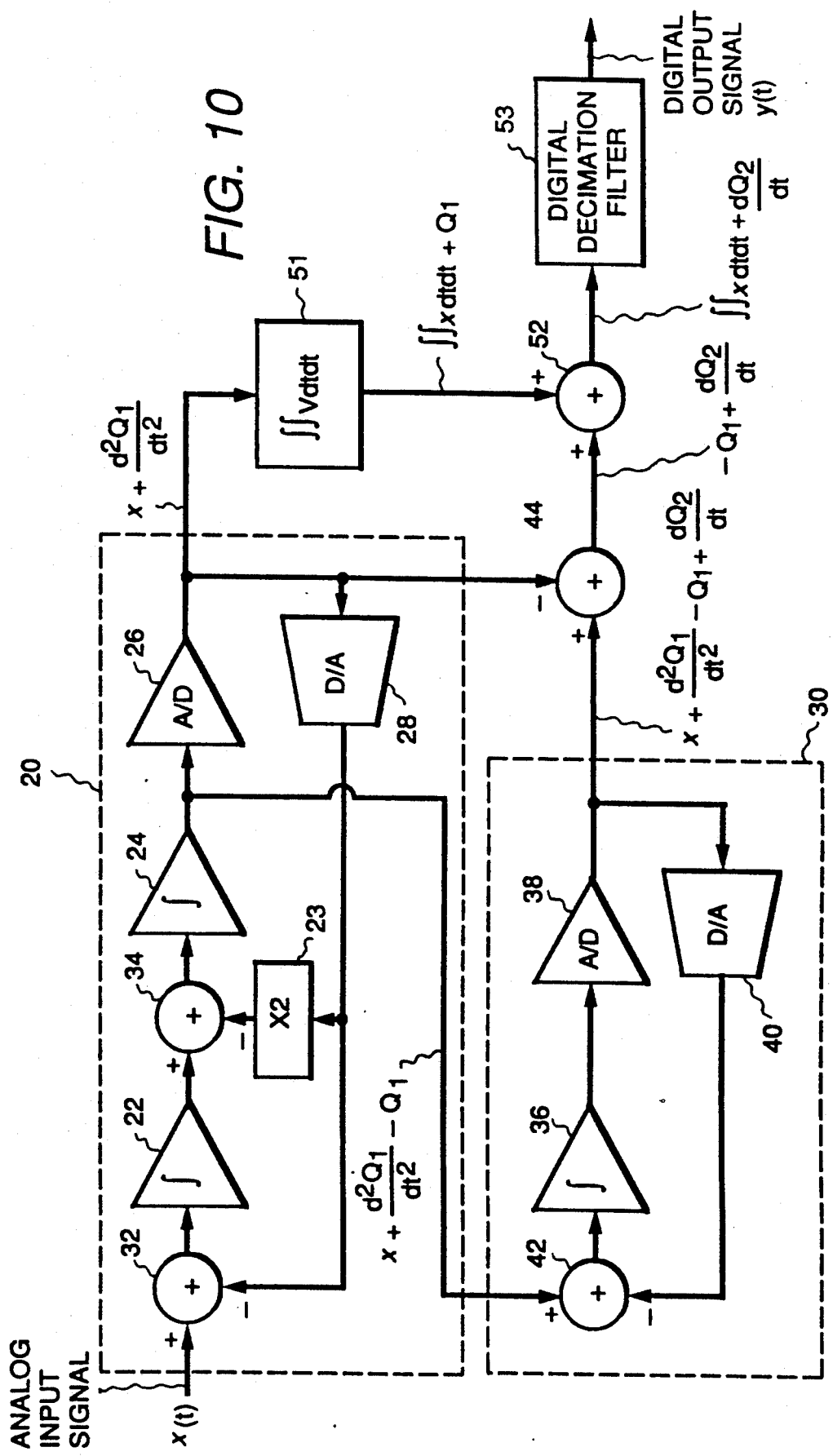
FIG. 10 is a circuit block diagram illustrating a third-order sigma-delta analog-to-digital converter network in accordance with the present invention, which is of a type alternative to the FIG. 3 type.

FIG. 10 shows a variant of the FIG. 3 third-order sigma-delta analog-to-digital converter network, which variant is an alternative embodiment of the invention. Rather than doubly differentiating the subtractor 44 difference output signal with respect to time and adding the result to the second-order modulator 20 output signal to cancel the quantization noise from the second-order modulator 20, the second-order modulator 20 output signal is doubly integrated in a digital double integrator 51, and the response of digital double integrator 51 is added in an digital adder 52 to the second-order modulator 20 output signal. The sum output signal from adder 52 includes a low-pass filtered (twice integrated) digitization of analog input signal plus first-order quantization noise from the first-order modulator 30. The quantization noise from the second-order modulator 20 does not appear in the sum output signal from adder 52, which is supplied to a digital decimation filter 53 that responds with a digital output signal y(t).

Figure 11:
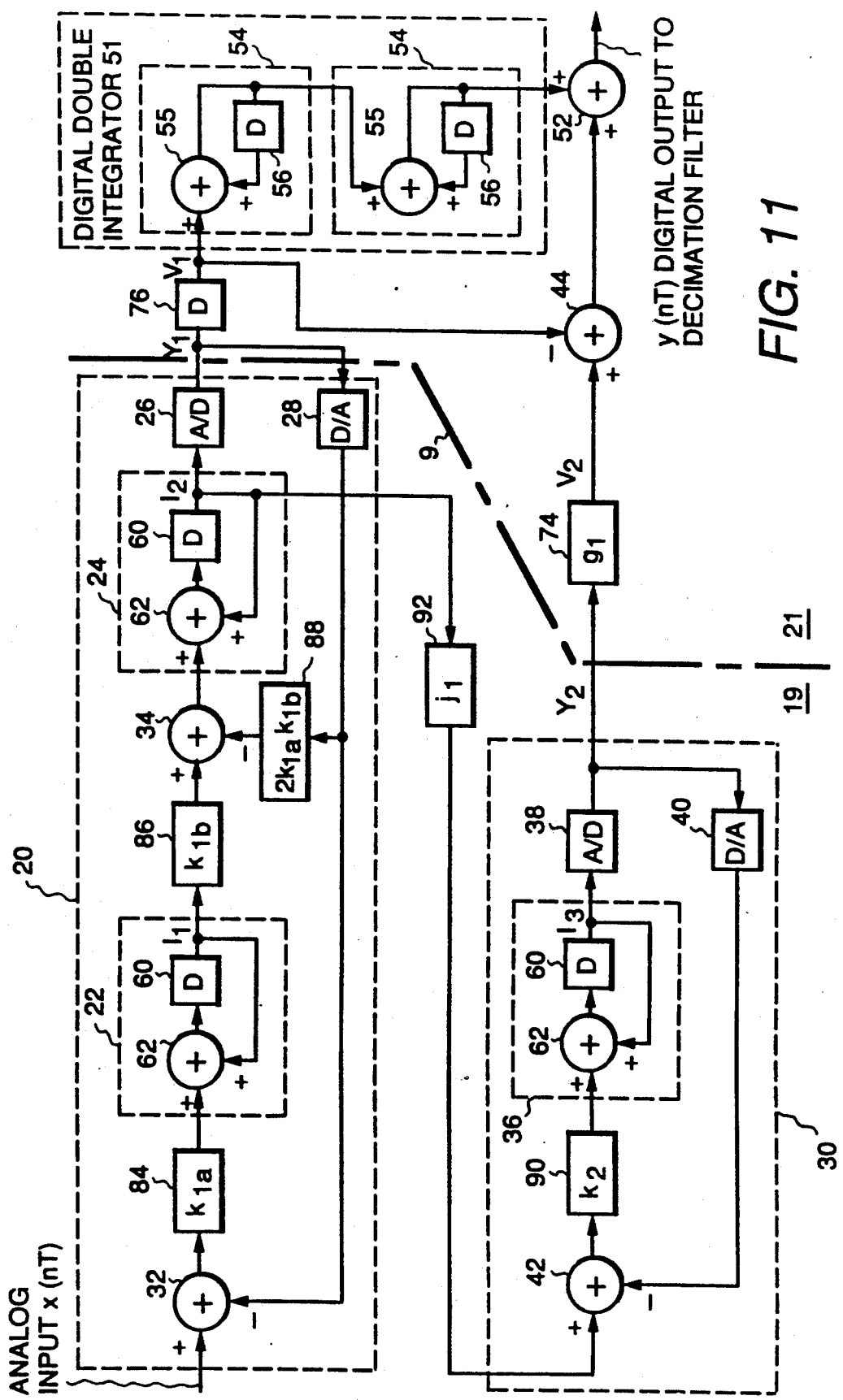
FIG. 11 is a functional block diagram of one version of the FIG. 10 type of third-order sigma-delta analog-to-digital converter network embodying the present invention.

FIG. 11 shows a variant of the FIG. 4 third-order sigma-delta analog-to-digital converter network, which variant is an alternative embodiment of the invention and is of the type shown generally in FIG. 10. The digital double integrator 51 is shown more particularly in FIG. 10 as a pair of cascaded integrators 54, each integrator 54 comprising a digital adder 55 and a delay register 56 for feeding back the sum output of the adder 55 to an input thereof.

Figure 12:
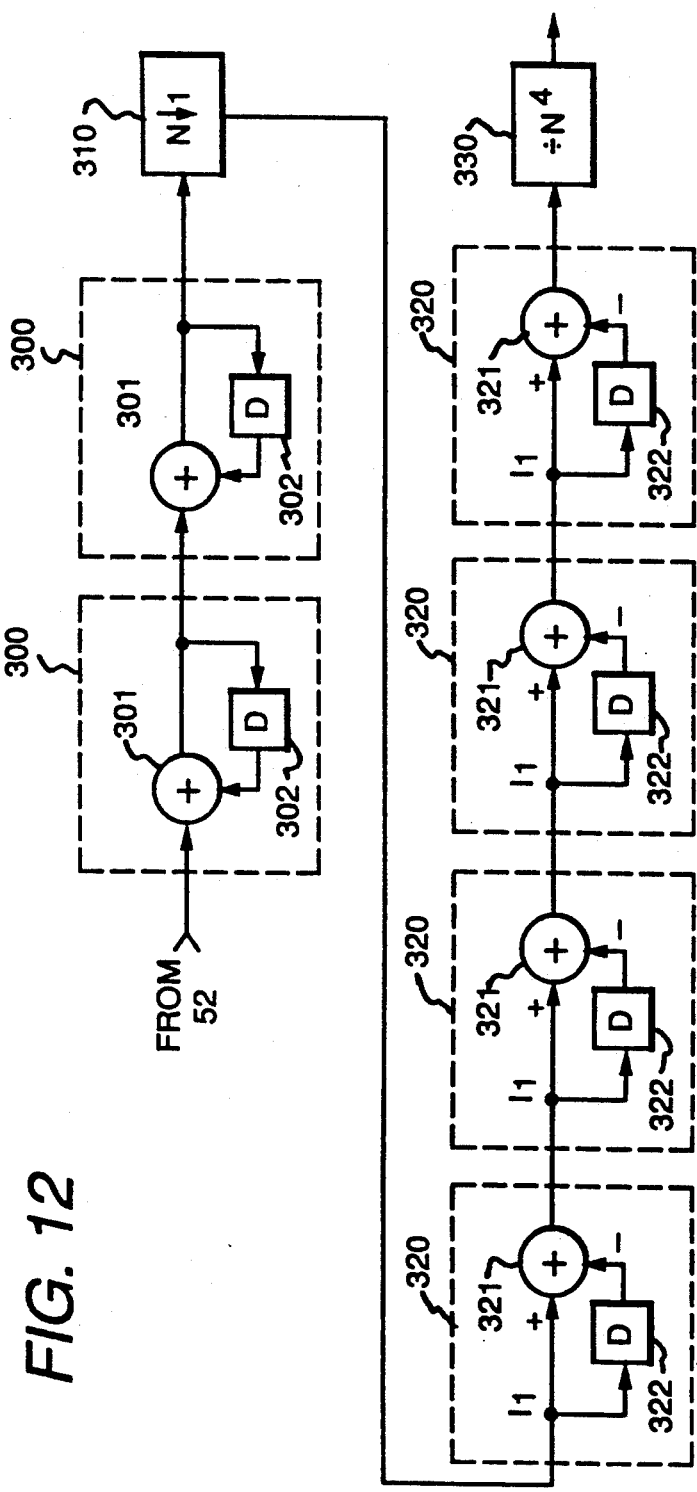
FIG. 12 is a circuit block diagram of a decimation filter for use with the FIG. 10 or FIG. 11 circuitry.

FIG. 12 shows a form the digital decimation filter 53 can take. The digital decimation filter 53, connected to receive as its input signal the sum output signal from the digital adder 52 of FIG. 10 or 11, supplies the same response as the digital decimation filter 50, connected to receive as its input signal the sum output signal from the digital adder 48 of FIG. 3 or 4. The leading two integrators 300 of the digital decimation filter 50 are dispensed with in the digital decimation filter 53, which is possible owing to the FIG. 10 or 11 third-order sigma-delta analog-to-digital converter network having the digital double integrator 51 for the output signal of the second-order modulator 20 and not having the digital double differentiator 46 for the output signal from the digital subtractor 44.

Figure 13:
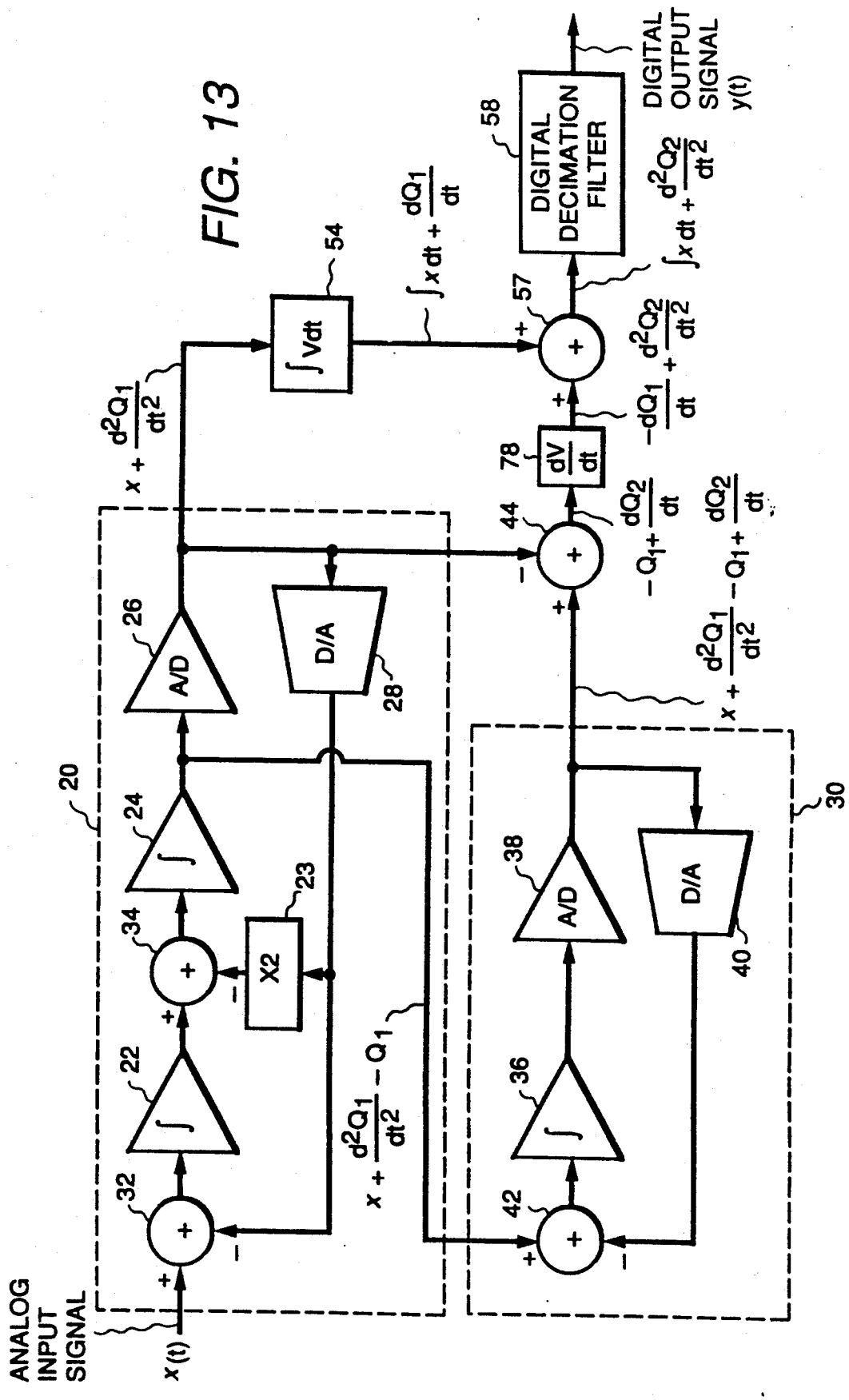
FIG. 13 is a circuit block diagram illustrating a third-order sigma-delta analog-to-digital converter network in accordance with the present invention, which is of a type alternative to the FIG. 3 and FIG. 9 types.

FIG. 13 shows variant of the FIG. 3 and FIG. 10 third-order sigma-delta analog-to-digital converter networks, which variant is another alternative embodiment of the invention. The subtractor 44 difference output signal is differentiated only once with respect to time in a single digital integrator 78, the second-order modulator 20 output signal is integrated only once in a digital integrator 54, and the responses of of digital integrator 78 and digital integrator 54 are added together in an digital adder 57. The sum output signal from adder 57 includes a low-pass filtered (once integrated) digitization of analog input signal plus second-order quantization noise from the first-order modulator 30. The quantization noise from the second-order modulator 20 does not appear in the sum output signal from adder 57, which is supplied to a digital decimation filter 58 that responds with a digital output signal y(t).

Figure 14:
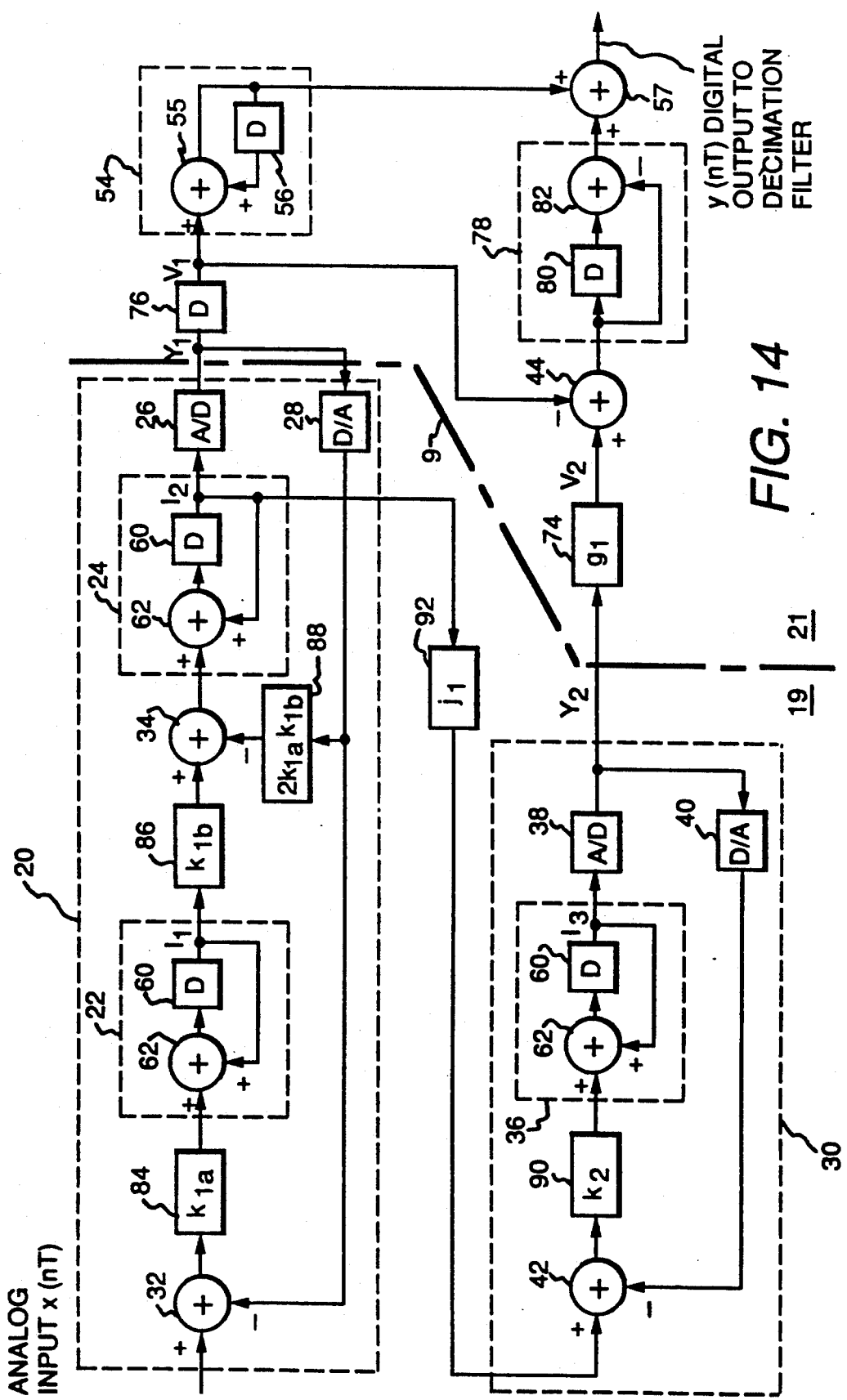
FIG. 14 is a functional block diagram of one version of the FIG. 13 type of third-order sigma-delta analog-to-digital converter network embodying the present invention.

FIG. 14 shows a variant of the third-order sigma-delta analog-to-digital converter networks of FIG. 4 and FIG. 11, which variant is an alternative embodiment of the invention and is of the type shown generally in FIG. 13. The differentiator 78 is shown as comprising a digital adder 82 for adding together the current sample of difference signal from subtractor 44 to the previous sample as stored in a delay register 80, thereby to generate a sum output signal that is the derivative respective to time of the difference signal from subtractor 44. The integrator 54 is shown as comprising a digital adder 55 and a delay register 56 for feeding back the sum output of the adder 55 to an input thereof.

Figure 15:
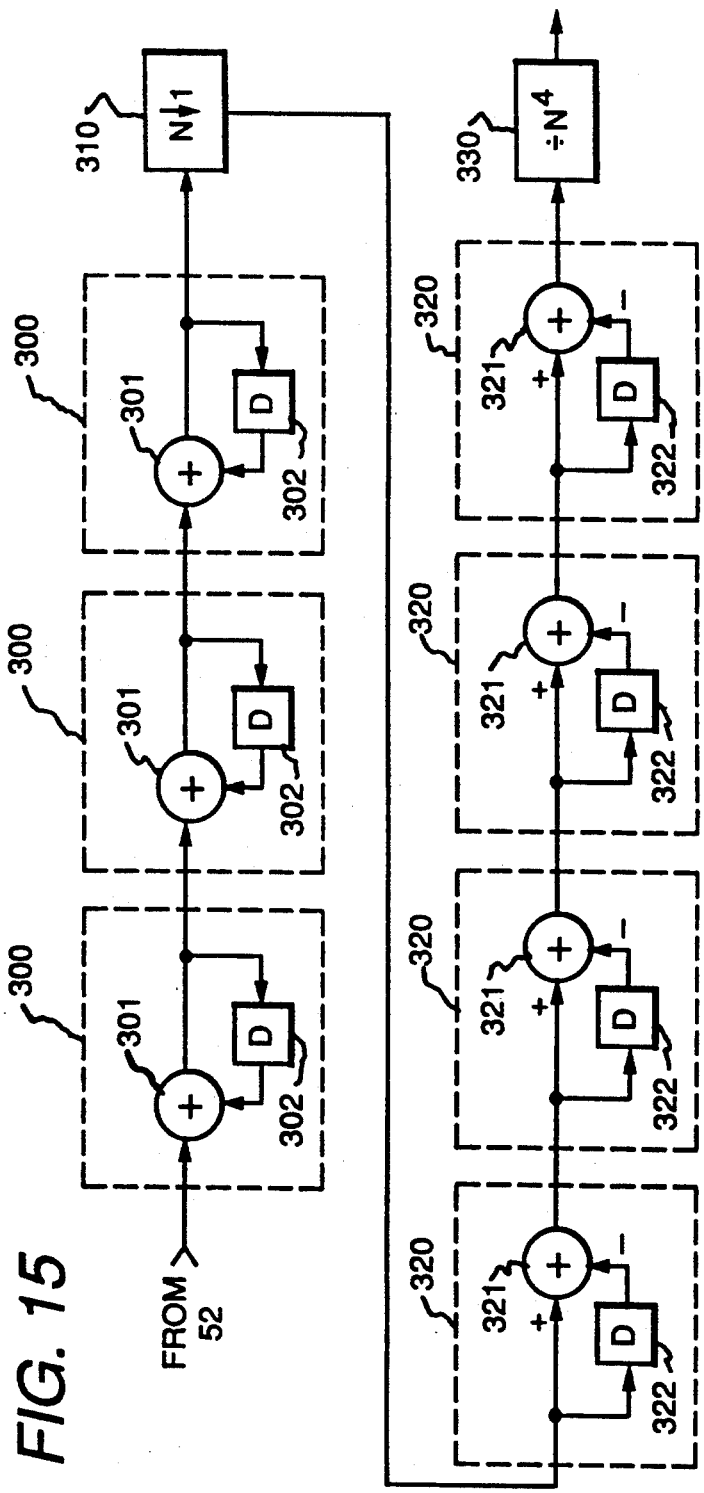
FIG. 15 is a circuit block diagram of a decimation filter for use the with FIG. 13 or FIG. 14 circuitry.

FIG. 15 shows a form the digital decimation filter 58 can take. The digital decimation filter 58, connected to receive as its input signal the sum output signal from the digital adder 52 of FIG. 13 or 14, supplies the same response as the digital decimation filter 50, connected to receive as its input signal the sum output signal from the digital adder 48 of FIG. 3 or 4. The leading integrator 300 of the digital decimation filter 50 is dispensed with in the digital decimation filter 58, which is possible owing to the FIG. 13 or 14 third-order sigma-delta analog-to-digital converter network having the digital integrator 54 for the output signal of the second-order modulator 20 and having only the single digital differentiator 78 for the output signal from the digital subtractor 44.

While only certain preferred features of the invention have been illustrated and described herein, many modifications and changes will occur to those skilled in the art in light of the teaching of this specification. It is, therefore, to be understood that the appended claims are intended to cover all such modifications and changes as fall within the true spirit of the invention.

Having thus described my invention, what I claim as new and desire to secure by Letters Patent is as follows:

1. A third-order sigma-delta analog-to-digital converter network, comprising:
   a second-order modulator comprising first and second integrators coupled in cascade such that the output of said first integrator is coupled to the input of said second integrator, said first integrator being adapted to receive an analog input signal, and a first analog-to-digital converter coupled to the output of said second integrator, said first analog-to-digital converter being adapted to convert an analog output signal from said second integrator into a first digital output signal corresponding to said analog input signal plus a second-order differential quantization noise component, said analog output signal corresponding to said first digital output signal less quantization noise of said second-order modulator;
   a first-order modulator comprising a third integrator, means coupling the output of said second integrator to the input of said third integrator, and a second analog-to-digital converter coupled to the output of said third integrator for converting said analog output signal of said second integrator into a second digital output signal corresponding to said analog output signal plus a first-order differential quantization noise component; and
   means for combining said first and second digital output signals of said second-order and first-order modulators to generate a digital output signal corresponding to said analog input signal essentially free of quantization noise from said second-order modulator.

2. The third-order sigma-delta analog-to-digital converter network of claim 1, including, within said means for combining said first and second digital output signals of said second-order and first-order modulators to generate a digital output signal corresponding to said analog input signal essentially free of quantization noise from said second-order modulator:
   digital subtractor means coupled to the outputs of said first and second analog-to-digital converters for providing a digital difference signal representative of the difference between the output signals of said first and second analog-to-digital converters.

3. The third-order sigma-delta analog-to-digital converter network of claim 2, further including, within said means for combining said first and second digital output signals of said second-order and first-order modulators to generate a digital output signal corresponding to said analog input signal essentially free of quantization noise from said second-order modulator:
   a digital double differentiator coupled to the output of said digital subtractor means for double differentiating said digital difference signal;
   digital adder means coupled to the outputs of said first analog-to-digital converter and said digital double differentiator for adding the output signal of said first analog-to-digital converter to the output signal of said digital double differentiator; and
   digital decimation filter means coupled to the output of said digital adder means for suppressing any triple differentiated quantization noise from the output signal of said digital adder means.

4. The third-order sigma-delta analog-to-digital converter network of claim 2, further including, within said means for combining said first and second digital output signals of said second-order and first-order modulators to generate a digital output signal corresponding to said analog input signal essentially free of quantization noise from said second-order modulator:
   a digital double integrator coupled to the output of said first analog-to-digital converter for double integrating the output signal of said first analog-to-digital converter;
   digital adder means coupled to the outputs of said digital subtractor means and said digital double integrator for adding the output signal of said digital subtractor means to the output signal of said digital double integrator; and
   digital decimation filter means coupled to the output of said digital adder means for suppressing any triple differentiated quantization noise from the output signal of said digital adder means.

5. The third-order sigma-delta analog-to-digital converter network of claim 2, further including, within said means for combining said first and second digital output signals of said second-order and first-order modulators to generate a digital output signal corresponding to said analog input signal essentially free of quantization noise from said second-order modulator:
   a digital differentiator coupled to the output of said digital subtractor means for differentiating said digital difference signal;
   a digital integrator coupled to the output of said first analog-to-digital converter for integrating the output signal of said first analog-to-digital converter;
   digital adder means coupled to the outputs of said digital differentiator and said digital integrator for adding the output signal of said digital differentiator to the output signal of said digital integrator; and
   digital decimation filter means coupled to the output of said digital adder means for suppressing any triple differentiated quantization noise from the output signal of said digital adder means.

6. The third-order sigma-delta analog-to-digital converter network of claim 1, wherein:
said second-order modulator includes a first digital-to-analog converter coupled in first and second feedback loops between the output of said first analog-to-digital converter and the inputs of said first and second integrators, respectively, and
said first-order modulator includes a second digital-to-analog converter coupled in a third feedback loop between the output of said second analog-to-digital converter and the input of said third integrator.

7. The third-order sigma-delta analog-to-digital converter network of claim 6, including, within said means for combining said first and second digital output signals of said second-order and first-order modulators to generate a digital output signal corresponding to said analog input signal essentially free of quantization noise from said second-order modulator:
digital subtractor means coupled to the outputs of said first and second analog-to-digital converters for providing a digital difference signal representative of the difference between the output signals of said first and second analog-to-digital converters.

8. The third-order sigma-delta analog-to-digital converter network of claim 7, further including, within said means for combining said first and second digital output signals of said second-order and first-order modulators to generate a digital output signal corresponding to said analog input signal essentially free of quantization noise from said second-order modulator:
a digital double differentiator coupled to the output of said digital subtractor means for double differentiating said digital difference signal;
digital adder means coupled to the outputs of said first analog-to-digital converter and said digital double differentiator for adding the output signal of said first analog-to-digital converter to the output signal of said digital double differentiator; and
digital decimation filter means coupled to the output of said digital adder means for suppressing any triple differentiated quantization noise from the output signal of said digital adder means.

9. The third-order sigma-delta analog-to-digital converter network of claim 7, further including, within said means for combining said first and second digital output signals of said second-order and first-order modulators to generate a digital output signal corresponding to said analog input signal essentially free of quantization noise from said second-order modulator:
a digital double integrator coupled to the output of said first analog-to-digital converter for double integrating the output signal of said first analog-to-digital converter;
digital adder means coupled to the outputs of said digital subtractor means and said digital double integrator for adding the output signal of said digital subtractor means to the output signal of said digital double integrator; and
digital decimation filter means coupled to the output of said digital adder means for suppressing any triple differentiated quantization noise from the output signal of said digital adder means.

10. The third-order sigma-delta analog-to-digital converter network of claim 7, further including, within said means for combining said first and second digital output signals of said second-order and first-order modulators to generate a digital output signal corresponding to said analog input signal essentially free of quantization noise from said second-order modulator:
a digital differentiator coupled to the output of said digital subtractor means for differentiating said digital difference signal;
a digital integrator coupled to the output of said first analog-to-digital converter for integrating the output signal of said first analog-to-digital converter;
digital adder means coupled to the outputs of said digital differentiator and said digital integrator for adding the output signal of said digital differentiator to the output signal of said digital integrator; and
digital decimation filter means coupled to the output of said digital adder means for suppressing any triple differentiated quantization noise from the output signal of said digital adder means.

11. The third-order sigma-delta analog-to-digital converter network of claim 6 wherein said means coupling the output of said second integrator to the input of said third integrator comprises an amplifier of gain $j_1$, said network further including:
a digital multiplier coupled to the output of said second analog-to-digital converter for multiplying said second digital output signal by a digital multiplier coefficient $g_1$;
said second-order modulator further including first circuit means having an analog scaling coefficient $k_{1a}$ for scaling the signal supplied to said first integrator and second circuit means having an analog scaling coefficient $k_{1b}$ for scaling the output signal of said first integrator.

12. The third-order sigma-delta analog-to-digital converter network of claim 11 wherein said first-order modulator further includes:
subtractor means coupled to the output of said amplifier of gain $j_1$ and to the output of said second digital-to-analog converter; and
third circuit means having an analog scaling coefficient $k_2$ for supplying a scaled version of the analog output signal of said subtractor means to said third integrator.

13. The third-order sigma-delta analog-to-digital converter network of claim 7 wherein said means coupling the output of said second integrator to the input of said third integrator comprises an amplifier of gain $j_1$, said network further including:
a digital multiplier coupled to the output of said second analog-to-digital converter for multiplying said second digital output signal by a coefficient $g_1$;
said first integrator having an analog scaling coefficient $k_{1a}$ for scaling the output signal thereof;
said first feedback loop further including first subtractor means responsive to said analog input signal and the output signal of said first digital-to-analog converter, and first circuit means having an analog scaling coefficient $k_{1a}$ for supplying the scaled output signal of said subtractor means to said first integrator;
said second feedback loop further including an analog scaling coefficient $2k_{1a}k_{1b}$ for scaling the output signal of said first digital-to-analog converter and second subtractor means having one input responsive to the scaled output signal of said first digital-to-analog converter, said cascade coupling of said first and second integrators including said second subtractor means and an analog scaling coefficient $k_{1b}$ for scaling the output signal of said first integrator and for applying the scaled output signal of said first integrator to a second input of said second subtractor means, the output of said second subtractor means being coupled to the input of said second integrator;

said coefficients being related according to $j_1g_1 = 1/k_{1a}k_{1b}$.

14. The third-order sigma-delta analog-to-digital converter network of claim 13 wherein each of said first, second and third integrators, respectively, comprises an analog adder for receiving an input signal at a first input thereof, and a delay register coupled to the output of said analog adder, the output of said delay register being coupled in a feedback configuration to a second input of said analog adder.

15. The third-order sigma-delta analog-to-digital converter network of claim 1 wherein each of said first, second and third integrators, respectively, includes balanced inputs and balanced outputs.

16. The third-order sigma-delta analog-to-digital converter of claim 1 wherein said first integrator is of a type that includes a chopper-stabilized amplifier in which chopping of input and output signals is done at a prescribed chopping rate and includes output to input feedback capacitance.

17. The third-order sigma-delta analog-to-digital converter of claim 1 in combination with:

a decimation filter for comb-filtering said digital output signal from the means for combining said first and second digital signals, said decimation filter having zeroes at said chopping rate and its harmonics.

18. A third-order sigma-delta analog-to-digital converter network comprising:

a second-order modulator responsive to an analog input signal for generating a first digital output signal corresponding to the analog input signal plus a second-order differential quantization noise component and for generating an analog output signal corresponding to said first digital output signal less quantization noise of said second-order modulator;

a first-order modulator responsive to said analog output signal of said second-order modulator for generating a second digital output signal corresponding to said analog output signal plus a first-order differential quantization noise component;

a digital subtractor for determining the difference between said first and second digital output signals to produce a digital difference signal comprising a first-order noise component from said first-order modulator less the quantization noise from said second-order modulator;

a digital double differentiator for twice differentiating said digital difference signal to produce a resultant digital signal including a third-order differential quantization noise component from said first-order modulator less a second-order differential quantization noise component from said second-order modulator;

a digital adder for adding said first digital output signal and said resultant digital signal to produce a third digital output signal in which the first-order and second-order differential noise components have been eliminated; and a digital decimation filter for suppressing the third-order differential noise component from said third digital output signal.

19. The third-order sigma-delta analog-to-digital converter network of claim 18, wherein:

said digital double differentiator comprises a pair of digital differentiators coupled in cascade, each of said differentiators, respectively, comprising a delay register and a digital subtractor having a first input coupled to the output of said delay register and a second input coupled to the input of said delay register.

20. The third-order sigma-delta analog-to-digital converter network of claim 19, wherein:

said second-order modulator comprises first and second integrators coupled in cascade such that the output of said first integrator is coupled to the input of said second integrator, and an analog-to-digital converter coupled to the output of said second integrator, said analog-to-digital converter being adapted to convert an analog output signal from said second integrator into said first digital output signal; and said first-order modulator comprises a third integrator having an input coupled to the output of said second integrator and a second analog-to-digital converter coupled to the output of said third integrator for converting the analog output signal of said second integrator into said second digital output signal.

21. A third-order sigma-delta analog-to-digital converter network comprising:

first and second integrators coupled in cascade such that the output of said first integrator is coupled to the input of said second integrator;

a first comparator coupled to the output of said second integrator for providing a first digital output signal;

a first switched reference voltage source;

means coupling said first switched reference voltage source to the output of said first comparator, said first integrator being responsive to an analog input signal and to said first switched reference source in order to provide a first analog output signal to said second integrator, said second integrator being responsive to said first analog output signal and to said first switched reference source in order to provide a selected analog output signal to said first comparator, said first comparator being responsive to said selected analog output signal to provide said first digital output signal;

a third integrator coupled to the output of said second integrator;

a second comparator coupled to the output of said third integrator for providing a second digital output signal;

a second switched reference voltage source;

means coupling said second switched reference voltage source to the output of said second comparator, said third integrator being responsive to said selected analog output signal and to said second switched reference source to provide a second selected analog output signal to said second comparator, said second comparator being responsive to said second selected analog output signal to produce said second digital output signal;

a digital multiplier for multiplying said second digital output signal by a multiplier coefficient;

a digital subtractor coupled to said digital multiplier and said first comparator for providing a digital difference signal therebetween;

a digital double differentiator coupled to said digital subtractor for twice differentiating said digital difference signal to produce a resultant digital signal;

a digital adder for adding said first digital output signal and said resultant digital signal to produce a third digital output signal; and a digital decimation filter responsive to said third digital output signal for producing a digital representation of said analog input signal.

22. The third-order sigma-delta analog-to-digital converter network of claim 21 wherein each of said first, second and third integrators comprises, respectively:

a differential amplifier having first and second inputs and an output;

a feedback capacitor connected between said output and said first input;

an input capacitor; and switching means for selectively connecting said input capacitor to a received analog voltage or to a reference voltage so as to charge or discharge said input capacitor, and for selectively connecting said input capacitor to said first input when said input capacitor is connected to said reference voltage.

23. The third-order sigma-delta analog-to-digital converter of claim 21, wherein said digital double differentiator comprises a pair of digital differentiators in cascade connection, each of said differentiators respectively comprising:

a respective delay register and a respective digital subtractor having a first input coupled to the output of its said respective delay register and a second input coupled to the input of its said respective delay register.

24. The third-order sigma-delta analog-to-digital converter network of claim 21 wherein said means coupling said first switched reference voltage source to the output of said first comparator comprises a first latch for storing said first digital output signal and wherein said means coupling said second switched reference voltage source to the output of said second comparator comprises a second latch for storing said second digital output signal, said first latch coupling said digital subtractor to said first comparator.

25. A third-order sigma-delta analog-to-digital converter network comprising:

first and second integrators coupled in cascade such that the output of said first integrator is coupled to the input of said second integrator;

a first comparator coupled to the output of said second integrator for providing a first digital output signal;

a first switched reference voltage source;

means coupling said first switched reference voltage source to the output of said first comparator, said first integrator being responsive to an analog input signal and to said first switched reference source in order to provide a first analog output signal to said second integrator, said second integrator being responsive to said first analog output signal and to said first switched reference source in order to provide a selected analog output signal to said first comparator, said first comparator being responsive to said selected analog output signal to provide said first digital output signal;

a third integrator coupled to the output of said second integrator;

a second comparator coupled to the output of said third integrator for providing a second digital output signal;

a second switched reference voltage source;

means coupling said second switched reference voltage source to the output of said second comparator, said third integrator being responsive to said selected analog output signal and to said second switched reference source to provide a second selected analog output signal to said second comparator, said second comparator being responsive to said second selected analog output signal to produce said second digital output signal;

a digital multiplier for multiplying said second digital output signal by a multiplier coefficient;

a digital subtractor coupled to said digital multiplier and said first comparator for providing a digital difference signal therebetween;

a digital double integrator for twice integrating said first digital output signal to produce a resultant digital signal;

a digital adder for adding said digital difference signal and said resultant digital signal to produce a third digital output signal; and a digital decimation filter responsive to said third digital output signal for producing a digital representation of said analog input signal.

26. The third-order sigma-delta analog-to-digital converter network of claim 25 wherein each of said first, second and third integrators comprises, respectively:

a differential amplifier having first and second inputs and an output;

a feedback capacitor connected between said output and said first input;

an input capacitor; and switching means for selectively connecting said input capacitor to a received analog voltage or to a reference voltage so as to charge or discharge said input capacitor, and for selectively connecting said input capacitor to said first input when said input capacitor is connected to said reference voltage.

27. The third-order sigma-delta analog-to-digital converter of claim 26, wherein said digital double integrator comprises a pair of digital integrators in cascade connection, each of said digital integrators respectively comprising:

a respective delay register and a respective digital adder having a first input, a second input coupled to the output of its said respective delay register, and an output coupled to the input of its said respective delay register.

28. The third-order sigma-delta analog-to-digital converter network of claim 25 wherein said means coupling said first switched reference voltage source to the output of said first comparator comprises a first latch for storing said first digital output signal and wherein said means coupling said second switched reference voltage source to the output of said second comparator comprises a second latch for storing said second digital output signal, said first latch coupling said digital subtractor to said first comparator.

29. A third-order sigma-delta analog-to-digital converter network comprising:

first and second integrators coupled in cascade such that the output of said first integrator is coupled to the input of said second integrator;

a first comparator coupled to the output of said second integrator for providing a first digital output signal;

a first switched reference voltage source;

means coupling said first switched reference voltage source to the output of said first comparator, said first integrator being responsive to an analog input signal and to said first switched reference source in order to provide a first analog output signal to said second integrator, said second integrator being responsive to said first analog output signal and to said first switched reference source in order to provide a selected analog output signal to said first comparator, said first comparator being responsive to said selected analog output signal to provide said first digital output signal;

a third integrator coupled to the output of said second integrator;

a second comparator coupled to the output of said third integrator for providing a second digital output signal;

a second switched reference voltage source;

means coupling said second switched reference voltage source to the output of said second comparator, said third integrator being responsive to said selected analog output signal and to said second switched reference source to provide a second selected analog output signal to said second comparator, said second comparator being responsive to said second selected analog output signal to produce said second digital output signal;

a digital multiplier for multiplying said second digital output signal by a multiplier coefficient;

a digital subtractor coupled to said digital multiplier and said first comparator for providing a digital difference signal therebetween;

a digital differentiator coupled to said digital subtractor for once differentiating said digital difference signal to produce a resultant differentiated digital signal;

a digital integrator for once integrating said first digital output signal to produce a resultant integrated digital signal;

a digital adder for adding said resultant differentiated digital signal and said resultant integrated digital signal to produce a third digital output signal; and a digital decimation filter responsive to said third digital output signal for producing a digital representation of said analog input signal.

30. The third-order sigma-delta analog-to-digital converter network of claim 24 wherein each of said first, second and third integrators comprises, respectively:

a differential amplifier having first and second inputs and an output;

a feedback capacitor connected between said output and said first input;

an input capacitor; and switching means for selectively connecting said input capacitor to a received analog voltage or to a reference voltage so as to charge or discharge said input capacitor, and for selectively connecting said input capacitor to said first input when said input capacitor is connected to said reference voltage.

31. The third-order sigma-delta analog-to-digital converter of claim 30, wherein said digital differentiator comprises:

a respective delay register and a digital subtractor having a first input coupled to the output of its said respective delay register and a second input coupled to the input of its said respective delay register; and wherein said digital integrator comprises:

a respective delay register and a digital adder having a first input, a second input coupled to the output of its said respective delay register, and an output coupled to the input of its said respective delay register.

32. The third-order sigma-delta analog-to-digital converter network of claim 29 wherein said means coupling said first switched reference voltage source to the output of said first comparator comprises a first latch for storing said first digital output signal and wherein said means coupling said second switched reference voltage source to the output of said second comparator comprises a second latch for storing said second digital output signal, said first latch coupling said digital subtractor to said first comparator.

* * * * *